United States Patent
Tamaki

(10) Patent No.: US 9,536,943 B2
(45) Date of Patent: Jan. 3, 2017

(54) VERTICAL POWER MOSFET

(71) Applicant: Renesas Electronics Corporation, Kanagawa (JP)

(72) Inventor: Tomohiro Tamaki, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 236 days.

(21) Appl. No.: 14/027,956

(22) Filed: Sep. 16, 2013

(65) Prior Publication Data
US 2014/0110779 A1  Apr. 24, 2014

(30) Foreign Application Priority Data
Oct. 24, 2012 (JP) ................................. 2012-234524

(51) Int. Cl.
| | |
|---|---|
| *H01L 29/66* | (2006.01) |
| *H01L 29/06* | (2006.01) |
| *H01L 29/78* | (2006.01) |
| *H01L 29/08* | (2006.01) |
| H01L 29/423 | (2006.01) |
| H01L 29/16 | (2006.01) |

(52) U.S. Cl.
CPC ....... *H01L 29/0634* (2013.01); *H01L 29/0878* (2013.01); *H01L 29/66727* (2013.01); *H01L 29/7802* (2013.01); *H01L 29/7813* (2013.01); *H01L 29/1608* (2013.01); *H01L 29/4238* (2013.01); *H01L 29/66734* (2013.01)

(58) Field of Classification Search
CPC ............. H01L 29/0634; H01L 29/0878; H01L 29/1095; H01L 29/66712; H01L 29/7802
USPC .......................................................... 257/330
See application file for complete search history.

(56) References Cited

U.S. PATENT DOCUMENTS

| | | | |
|---|---|---|---|
| 5,900,662 A * | 5/1999 | Frisina | H01L 29/7802 257/139 |
| 6,475,864 B1 * | 11/2002 | Sato et al. | 438/268 |
| 7,420,245 B2 | 9/2008 | Yamashita et al. | |
| 7,642,597 B2 | 1/2010 | Saito | |

(Continued)

FOREIGN PATENT DOCUMENTS

| | | |
|---|---|---|
| JP | 2006-066421 | 3/2006 |
| JP | 2007-300034 | 11/2007 |

(Continued)

OTHER PUBLICATIONS

Japanese Official Action—2012-234524—Sep. 15, 2016.

*Primary Examiner* — John C Ingham
*Assistant Examiner* — Frederick B Hargrove
(74) *Attorney, Agent, or Firm* — Young & Thompson

(57) ABSTRACT

Vertical power MOSFETs having a super junction are devices capable of having a lower on resistance than other vertical power MOSFETs. Although they have the advantage of high-speed switching due to rapid depletion of an N type drift region at the time of turn off in switching operation, they are likely to cause ringing. A vertical power MOSFET having a super junction structure provided by the present invention has, in the surface region of a first conductivity type drift region under a gate electrode, an undergate heavily doped N type region having a depth shallower than that of a second conductivity type body region and having a concentration higher than that of the first conductivity type drift region.

12 Claims, 23 Drawing Sheets

(56) References Cited

U.S. PATENT DOCUMENTS

| | | |
|---|---|---|
| 8,058,688 B2 | 11/2011 | Ono et al. |
| 8,921,925 B2 | 12/2014 | Nakajima |
| 9,087,893 B2 | 7/2015 | Onishi et al. |
| 2006/0043481 A1 | 3/2006 | Yamashita et al. |
| 2008/0017897 A1* | 1/2008 | Saito et al. .................. 257/288 |
| 2008/0135930 A1 | 6/2008 | Saito |
| 2008/0237774 A1 | 10/2008 | Ono et al. |
| 2010/0044791 A1 | 2/2010 | Herbert |
| 2011/0241068 A1 | 10/2011 | Watanabe et al. |
| 2011/0241111 A1 | 10/2011 | Tamaki et al. |

FOREIGN PATENT DOCUMENTS

| | | | |
|---|---|---|---|
| JP | 2008-091450 | 4/2008 | |
| JP | 2008-124346 | 5/2008 | |
| JP | WO 2011093473 A1 * | 8/2011 | ......... H01L 29/0634 |
| JP | 2011-216587 | 10/2011 | |
| JP | 2011-228643 | 11/2011 | |
| JP | 2012-142330 | 7/2012 | |

\* cited by examiner

VERTICAL POWER MOSFET

CROSS-REFERENCE TO RELATED APPLICATIONS

The disclosure of Japanese Patent Application No. 2012-234524 filed on Oct. 24, 2012 including the specification, drawings and abstract is incorporated herein by reference in its entirety.

BACKGROUND

The present application relates to a power MOSFET (a semiconductor device or semiconductor integrated circuit device) which can be applied to, for example, high speed switching device technology.

Japanese Patent Laid-Open No. 2011-216587 (Patent Document 1) or U.S. Patent Publication No. 2011-241111 (Patent Document 2) corresponding thereto relates to a planar type vertical power MOSFET having a super junction. In order to secure a charge balance in a wide range in a depth direction, it discloses the technology of dividing an N type column region configuring a super junction into an upper half portion and a lower half portion at a position sufficiently deeper than a P type body region and making the concentration of the upper half portion relatively higher.

Japanese Patent Laid-Open No. 2008-124346 (Patent Document 3) or U.S. Pat. No. 7,642,597 (Patent Document 4) corresponding thereto relates to a trench gate type vertical power MOSFET having a buried field plate and a super junction. In order to relax electric field concentration at the lower end portion of the buried field plate, it discloses the technology of dividing not a P type body region but an N type column region (N pillar) lying below the lower end of the P type body region into an upper half portion and a lower half portion and making the concentration of the upper half portion relatively higher.

Japanese Patent Laid-Open No. 2008-91450 (Patent Document 5) or U.S. Pat. No. 8,058,688 (Patent Document 6) corresponding thereto relates to a planar type vertical power MOSFET having a super junction. It discloses the technology of dividing not a P type body region but an N type column region (N pillar) present below the lower end of the P type body region into two or more regions and making the concentration of the upper portion relatively higher.

Japanese Patent Laid-Open No. 2007-300034 (Patent Document 7) or U.S. Patent Publication No. 2008-17898 (Patent Document 8) corresponding thereto relates to a trench gate type vertical power MOSFET having a super junction. It discloses the technology of dividing not a P type body region but an N type column region (N pillar) below the lower end of the P type body region into an upper half portion and a lower half portion and making the concentration of an upper part of the upper half portion relatively higher and the concentration of a lower part of the lower half portion relatively higher.

Japanese Patent Laid-Open No. 2006-66421 (Patent Document 9) or U.S. Pat. No. 7,420,245 (Patent Document 10) corresponding thereto relates to a planar type vertical power MOSFET having a super junction. In order to secure a charge balance in a wide range in a depth direction, it discloses the technology of dividing an N type column (N pillar) region configuring a super junction into an upper half portion and a lower half portion at a position sufficiently deeper than a P type body region and making the concentration of the upper half portion relatively higher.

[Patent Document 1] Japanese Patent Laid-Open No. 2011-216587
[Patent Document 2] US Patent Publication No. 2011-241111
[Patent Document 3] Japanese Patent Laid-Open No. 2008-124346
[Patent Document 4] U.S. Pat. No. 7,642,597
[Patent Document 5] Japanese Patent Laid-Open No. 2008-91450
[Patent Document 6] U.S. Pat. No. 8,058,688
[Patent Document 7] Japanese Patent Laid-Open No. 2007-300034
[Patent Document 8] US Patent Publication No. 2008-17897
[Patent Document 9] Japanese Patent Laid-Open No. 2006-66421
[Patent Document 10] U.S. Pat. No. 7,420,245

SUMMARY

A vertical power MOSFET having a super junction is a device capable of having a reduced on resistance compared with another vertical power MOSFET. It has the advantage of high speed switching due to rapid depletion of an N type drift region during turn off in switching operation but on the other hand, has the disadvantage that it is likely to cause ringing.

Means and the like for overcoming the above-mentioned problem will next be described. The other problems and novel features will be apparent from the description herein and accompanying drawings.

The outline of typical embodiments, among embodiments disclosed herein, will next be described briefly.

The outline of First embodiment of the present application is a vertical power MOSFET having a super junction structure and it has, in the surface of a first conductivity type drift region at the periphery under a gate electrode, a first conductivity type undergate heavily doped N type region shallower than a second conductivity type body region and having a concentration higher than that of the first conductivity type drift region.

Advantages available by typical embodiments, among embodiments disclosed herein, will next be described briefly.

First embodiment of the present application makes it possible to suppress generation of ringing while maintaining high-speed switching characteristics.

DETAILED DESCRIPTION

Outline of the Preferred Embodiments

Figure 1:
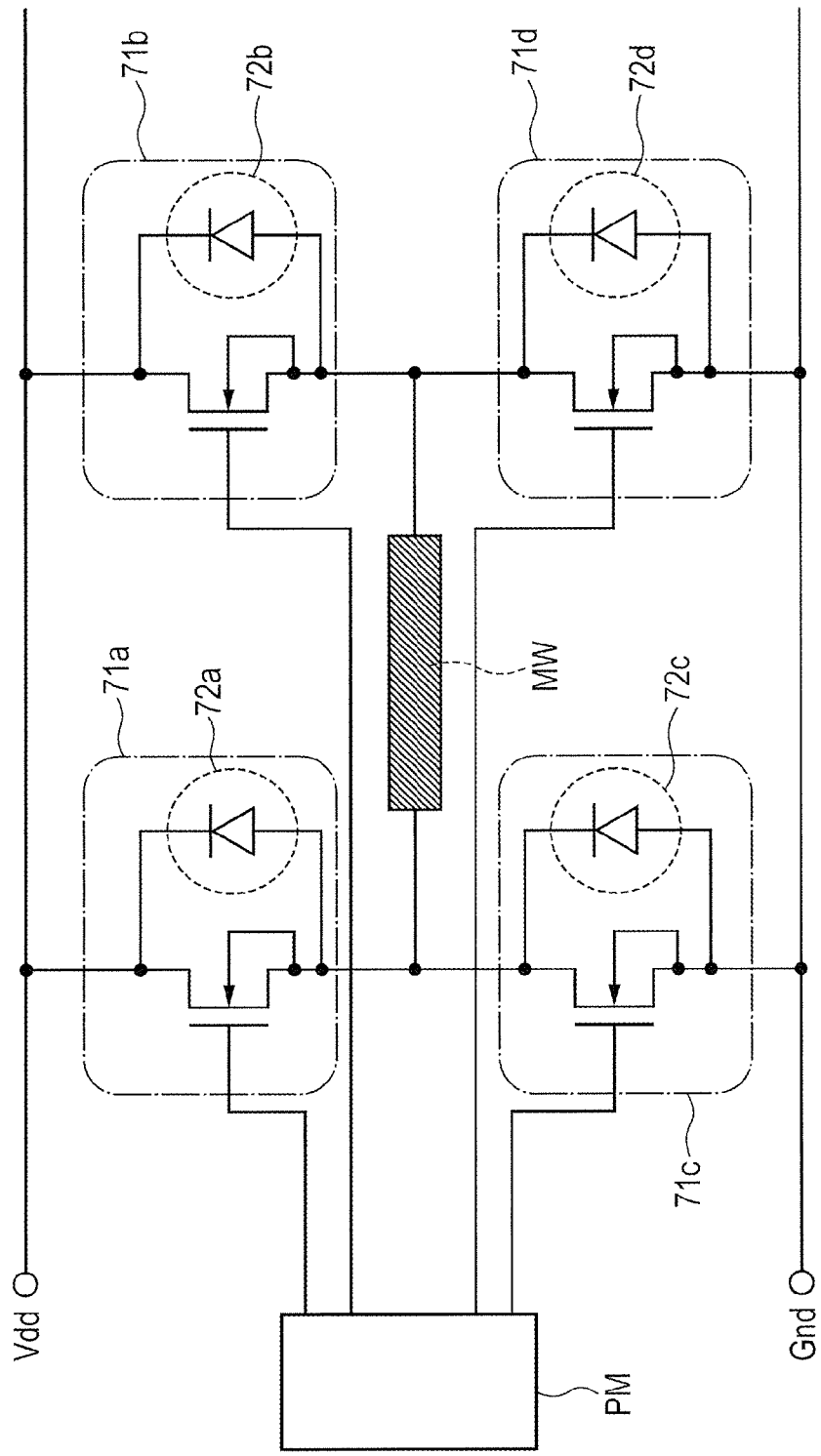
FIG. 1 is a schematic circuit diagram of a motor driven half bridge circuit for describing one example of a typical circuit to which a vertical planar power MOSFET according to First embodiment of the present application has been applied.

First, typical embodiments disclosed herein will be outlined.

1. A vertical power MOSFET, includes:

(a) a semiconductor substrate having a first main surface and a second main surface;

(b) a cell region extending from the first main surface of the semiconductor substrate to the inside thereof;

(c) a drain region having a first conductivity type provided in the surface of the second main surface;

(d) a drift region which is provided in the cell region and in a main portion extending from a boundary with the drain region to the first main surface and in which columnar first conductivity type drift regions and columnar second conductivity type drift regions having a conductivity type opposite to the first conductivity type have been placed alternately;

(e) a gate electrode provided, via a gate insulating film, in a surface region on the side of the first main surface and on the surface of each of the columnar first conductivity type drift regions;

(f) a body region having the second conductivity type provided in the surface of the drift region on the side of the first main surface and extending from each of the columnar second conductivity type drift regions to the columnar first conductivity type drift region adjacent thereto;

(g) an undergate heavily doped N type region having the first conductivity type provided in the surface of each of the columnar first conductivity type drift regions along the gate electrode and between a pair of the body regions adjacent to each other, having a depth shallower than that of the body region, and having a concentration higher than that of the columnar first conductivity type drift region;

(h) a source region having the first conductivity type provided in the surface of each of the body regions and extending from the vicinity of the end portion of the gate electrode to the outside and having a concentration higher than that of the undergate heavily doped N type region;

(i) a metal source electrode provided over the first main surface of the semiconductor substrate and electrically coupled to the body region and the source region; and (j) a metal drain electrode provided over the second main surface of the semiconductor substrate and electrically coupled to the drain region.

2. In the vertical power MOSFET as described above in 1, the semiconductor substrate is a silicon-based semiconductor substrate.

3. In the vertical power MOSFET as described above in 1 or 2, the first conductivity type is an N type.

4. In the vertical power MOSFET as described above in any one of 1 to 3, the undergate heavily doped N type region has an impurity concentration higher than that of the columnar second conductivity type drift region.

5. In the vertical power MOSFET as described above in any one of 1 to 4, an impurity having the first conductivity type for forming the undergate heavily doped N type region is introduced by ion implantation.

6. In the vertical power MOSFET as described above in any one of 1 to 5, the undergate heavily doped N type region has a concentration lower than that of the body region.

7. In the vertical power MOSFET as described above in any one of 1 to 6, the impurity having the first conductivity type for forming the undergate heavily doped N type region is introduced into a region wider than a region between the pair of the body regions adjacent to each other.

8. In the vertical power MOSFET as described above in any of 1 to 7, the impurity having the first conductivity type for forming the undergate heavily doped N type region is introduced in almost the entirety of the cell region.

9. In the vertical power MOSFET as described above in any one of 1 to 8, the gate electrode is provided over the entire surface of a portion facing onto the undergate heavily doped N type region.

10. In the vertical power MOSFET as described above in any one of 1 to 9, the undergate heavily doped N region has been introduced using ion implantation.

11. The vertical power MOSFET as described above in any one of 1 to 10 is a planar gate type.

12. The vertical power MOSFET as described above in any one of 1 to 10 is a trench gate type.

[Explanation of Description Form, Basic Terminology, and Use Thereof in Present Application>

1. In the present application, a description in embodiments may be made after divided in a plurality of parts or sections if necessary for convenience's sake. These parts or sections are not independent from each other, but they may each be a part of a single example or one of them may be a partial detail of the other or a modification example of a part or whole of the other one unless otherwise specifically indicated. In principle, a description on a portion similar to that described before is not repeated. Moreover, constituents in the embodiments are not essential unless otherwise specifically indicated, limited to the number theoretically, or principally apparent from the context that they are essential.

Further, the term "semiconductor device" as used herein embraces mainly each of various single transistors (active elements), a device obtained by integrating such a single transistor as a main component with a resistor, a capacitor, and the like on a semiconductor chip or the like (for example, a single crystal silicon substrate), and a packaged semiconductor chip or the like. Typical examples of the various transistors include MISFET (metal insulator semiconductor field effect transistor) typified by MOSFET (metal oxide semiconductor field effect transistor). Typical examples of the various single transistors include power MOSFET and IGBT (insulated gate bipolar transistor).

The term "semiconductor active element" as used herein means a transistor, a diode, or the like.

Semiconductor elements for high power use capable of treating electricity of several watt or greater are usually called "power semiconductor elements" or "power semiconductor devices". The power MOSFET treated mainly in the present application belongs to power semiconductor devices and can be roughly classified into vertical power MOSFET and lateral power MOSFET. In general, a lateral power MOSFET has a source electrode and a drain electrode in the surface of a chip, while a vertical power MOSFET has a source electrode in the surface of a chip and a drain electrode on the back surface.

This vertical power MOSFET can be classified further into a planar type power MOSFET and a trench type power MOSFET. In the following embodiments, a planar type power MOSFET will be described in detail as an example, but it is needless to say that the structure described herein can also be applied to a trench type power MOSFET (refer to, for example, Sub-section (6) of Section 4).

2. Similarly in the description of the embodiments, with regard to material, composition or the like, the term "X composed of A" or the like does not exclude X having, as one of the main constituents thereof, a component other than A unless otherwise specifically indicated or principally apparent from the context that it is not. For example, with regard to a component, the term "X composed of A" means that "X has A as a main component thereof". It is needless to say that, for example, the term "silicon member" or "silicon-based member" is not limited to a member made of pure silicon but also means a member made of a SiGe alloy or another multi-element alloy having silicon as a main component or a member containing another additive.

For example, the term "silicon-based semiconductor substrate" means not only a silicon substrate or a substrate obtained by introducing an ordinarily employed impurity such as phosphorus, arsenic, antimony or boron into an epitaxial region, a buried epitaxial region, or another impurity doping region on the silicon substrate but also such a substrate containing carbon (from 0 to several at %), germanium (from 0 to about 35 at %), or the like.

Similarly, the term "silicon oxide film", "silicon oxide-based insulating film", or the like is not limited to a relatively pure undoped silicon oxide (undoped silicon dioxide) but it embraces an insulating film having silicon oxide as a main component. Impurity-doped silicon oxide-based insulating films such as a TEOS-based silicon oxide (TEOS-based silicon oxide) film, a PSG (phosphorus silicate glass) film, or a BPSG (borophosphosilicate glass) film are also silicon oxide films. In addition, a thermal oxide film, a CVD oxide film, and also films obtained by the method of application such as SOG (spin on glass) film and nano-clustering silica (NCS) film are also silicon oxide films or silicon oxide-based insulating films. Low-k insulating films such as FSG (fluorosilicate glass), SiOC (silicon oxycarbide), carbon-doped silicon oxide, or OSG (organosilicate glass) films are also silicon oxide films or silicon oxide-based insulating films. Silica-based low-k insulating films (porous insulating films in which the term "porous" includes "molecular porous") obtained by introducing pores into such a member are also silicon oxide films or silicon oxide-based insulating films.

As a silicon-based insulating film commonly used in a semiconductor field along with a silicon oxide-based insulating film, there is a silicon nitride-based insulating film. Materials belonging to this system include SiN, SiCN, SiNH, and SiCNH. The term "silicon nitride" as used herein embraces both SiN and SiNH unless otherwise specifically indicated. Similarly, the term "SiCN" embraces both SiCN and SiCNH unless otherwise specifically indicated. SiC has properties similar to those of SiN while, in most cases, SiON should rather be classified into a silicon oxide-based insulating film. When it is used as an etch stop film, however, it is close to SiC, SiN, or the like.

A silicon nitride film is frequently used as an etch stop film, that is, a CESL (contact etch-stop layer) in SAC (self-aligned contact) technology and in addition, it is also used as a stress imparting film in SMT (stress memorization technique).

3. Preferred examples of the shape, position, attribute, and the like will be shown below, however, it is needless to say that the shape, position, attribute, and the like are not strictly limited to these preferred examples unless otherwise specifically indicated or apparent from the context that they are not. The term "square" means "almost square", the term "perpendicular to" means "almost perpendicular to", and the term "coincide" means "almost coincide". This equally applies to the terms "parallel" and "right angle". Lines about 10 degrees deviated from completely parallel lines are regarded as almost parallel lines.

With regard to a certain region, the term "entire", "overall", "whole", or the like embraces "almost entire", "almost overall", "almost whole", or the like. Therefore, the term "almost entire", "almost overall", or "almost whole" is used with regard to a certain region, it means 80% or greater of the certain region. This will equally apply to "entire circumference", "entire length", or the like.

Further, with regard to the shape of a certain member, the term "rectangular" embraces "almost rectangular". When the member has a portion which is not rectangular and the area of the portion is less than about 20% of the whole area, the member is regarded to have "almost rectangular" shape. This will equally apply to the term "circular" or the like.

The term "periodic" embraces "almost periodic". With regard to respective elements, when the deviation of a period is less than about 20%, the respective elements are "almost periodic". Moreover, when the elements outside of this range account for less than about 20% of all the elements which should be periodic, the elements as a whole can be regarded as "almost periodic".

The definition in this section is a general one and if there is a different definition in the following respective descriptions, priority is placed on the definition in the respective descriptions. The definition or specification in this section is however still effective for a part not defined in the respective descriptions insofar as it is not denied definitely.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor integrated circuit device (which may be a semiconductor integrated circuit device or an electronic device) is to be formed. It is however needless to say that it embraces a composite wafer of an insulating substrate and a semiconductor layer or the like, such as an epitaxial wafer, a SOI substrate, or an LCD glass substrate.

The term "semiconductor substrate" as used herein embraces the whole or a portion of a semiconductor wafer or a semiconductor chip which has been subjected to treatment such as etching, epitaxial growth, or film formation.

6. In general, a super junction structure is such that, into a semiconductor region of a certain conductivity type, columnar or plate-like column regions of the opposite conductivity type have been inserted at almost equal intervals so as to maintain a charge balance. In the present application, when reference is made to a "super junction structure" formed by a trench-fill method, it refers to, in principle, a structure in which, into a semiconductor region of a certain conductivity type, plate-like (typically flat plate-like, but may also be curved or bent plate-like) "column regions" of the opposite conductivity type have been inserted at almost equal intervals so as to keep a charge balance. In the embodiment, a description will be given to a structure formed by placing P type columns in parallel at equal intervals in an N type semiconductor layer (for example, a drift region). The thickness Wp (for example, FIG. 4) of the P type column of each portion may be different from each other, depending on the position. When the trench fill method is employed for the manufacture, the thickness Wp (width) is preferably the same, because difference in the trench width will lead to difference in burying characteristics at respective positions.

In the present application, a drift region without a super junction structure may be called "single conductivity type drift region".

The term "orientation" in the super junction structure means the longer direction of a P type column or an N type column configuring the super junction structure when it is viewed two-dimensionally with respect to the main surface of a chip (in a plane parallel to the main surface of the chip or wafer).

The term "peripheral super junction structure" means a super junction structure provided in a peripheral outside area of an active cell area, that is, junction edge termination area. On the other hand, a super junction structure provided in a cell region is called "cell region super junction structure".

On the other hand, the term "guard ring" in a chip peripheral area means an almost ring-shaped field plate (reverse field plate from the standpoint of an effect) electrically coupled to a semiconductor substrate (for example, drain potential) thereunder. The term "ring shaped (circular)" as used herein usually means a closed loop (the shape of this loop may be almost rectangular ring, almost circular ring, or almost elliptical ring), but the ring is not necessarily closed in a strict sense. It may be closed when viewed externally. This means that conductors separated from each other may be arranged in a ring form. It is needless to say that a closed loop is preferred from the standpoint of withstand voltage characteristics.

The term "rectangle" or "rectangular shape" as used herein means a substantially square or rectangular shape, but it may have irregularities having a relatively small area compared with the whole area or may be rounded or chamfered. When rectangles have the "same orientation", it means that they are, as a corresponding plane shape, almost the same in at least one of rotational axes of symmetry. In other words, corresponding sides are almost parallel to each other.

The term "keep a local charge balance" as used herein means that for example when the main surface of a chip is viewed two-dimensionally, a charge balance is kept within a range of a distance corresponding to about the thickness (Wp, Wn) of a column.

The term "withstand voltage" or "withstand voltage characteristics" as used herein mean as source-drain withstand voltage in the case of a power MOSFET and an anode-cathode withstand voltage in the case of a diode unless otherwise specifically indicated.

7. When with regard to impurity regions, "A has a concentration higher than that of B" and a concentration change is large, depending on the position such as depth, a peak concentration is compared between these two regions. Similarly, when "A has a depth shallower than that of B" and a concentration change is large, depending on the position such as depth, a peak concentration is compared between these two regions.

When the concentration shows a relatively gradual change or a concentration change tends to be flat, a representative value such as average value is used as a standard. In such cases, the term "concentration" means so-called net doping concentration.

8. The term "gate insulating film" as used herein in a trench gate type device means not only a portion adjacent to a channel serving as a gate but also an insulating film present between a portion under and on both sides of a trench gate electrode and a semiconductor substrate.

The term "undergate heavily doped N type region (undergate heavily doped N type region having a first conductivity type)" is a region formed not only under a gate electrode but, for example in a trench gate structure, below and on both sides below the gate electrode, which is however not essential.

Further Detailed Description of the Preferred Embodiments

Embodiments will be described in further detail. In all the drawings, the same or like members will be identified by the same or like symbols or reference numerals and overlapping descriptions will be omitted in principle.

In the accompanying drawings, hatching or the like is sometimes omitted even from the cross-section when it makes the drawing cumbersome and complicated or when a member can be discriminated clearly from a vacant space. In relation thereto, even a two-dimensionally closed hole may have a background outline thereof omitted when it is obvious from the description or the like that the hole is two-dimensionally closed and so on. On the other hand, even a portion other than a cross section may be hatched to clearly show that the hatched portion is not a vacant space.

In alternative naming of two members or the like, when one is called "first" and the other is called "second, they may be exemplified while relating them along the typical embodiment. It is however needless to say that even the member called "first member" is not limited to this choice.

The present inventors have recently filed a patent application on a power MOSFET having a super junction, for example, Japanese Patent Application No. 2012-138470 (filed in Japan on Jun. 20, 2012) and Japanese Patent Application No. 2011-176794 (filed in Japan on Aug. 12, 2011).

1. Description on One Example of a Typical Circuit to which a Vertical Power MOSFET According to First Embodiment of the Present Application has been Applied (Mainly FIG. 1)

It is not a chief object to describe the circuit itself so that a circuit simplest in principle will next be described as an example. The description will therefore be made, while taking, as an example, a relatively simple motor as an object to be controlled, a PWM (pulse width modulation) method as a control method, and a full bridge circuit as a drive circuit. Alternatively, the object to be controlled may be a multi-phase (for example, three-phase) brushless motor, the control method may be, for example, a PAM (pulse amplitude modulation) method, and the drive circuit may be, for example, a multi-leg (for example, three leg) half bridge circuit.

FIG. 1 is a schematic circuit diagram of a motor driven H bridge circuit for describing one example of a typical circuit to which a vertical planar power MOSFET according to First Embodiment of the present application has been applied. Based on it, one example of a typical circuit to which the vertical power MOSFET of First embodiment of the present application has been applied will next be described.

This inverter circuit has a full bridge structure and has a first leg comprised of driver MOSFETs (71a, 71c) and a second leg comprised of driver MOSFETs (71b and 71d). A motor winding MW is coupled between them. For example, a DC supply voltage terminal VDD has been coupled to the upper end of the bridge circuit and for example a ground voltage terminal Gnd has been coupled to the lower end of the bridge circuit. The driver MOSFETs (71a, 71b, 71c, and 71d) have therein body diode portions (72a, 72b, 72c, and 72d) which are structurally necessary. Gate driving signals, for example, by a PWM scheme are supplied to the gate terminals of the driver MOSFETs (71a, 71b, 71c, and 71d) from a pulse modulation gate driver circuit PM.

2. Description on the Device Structure and the Like of the Vertical Planar Power MOSFET According to First Embodiment of the Present Application (Mainly from FIGS. 2 to 4)

A specific description will next be made while taking as an example a device formed on a silicon-based semiconductor substrate (including the back surface and the inside of the semiconductor substrate) such as mainly a silicon single crystal substrate (including an epitaxial substrate). Needless to say, the following example can be applied not only to it but also to a device formed on an SiC-based semiconductor substrate or another semiconductor substrate.

In addition, a specific description will be made while mainly taking a single device as an example, but needless to say, the present embodiment can be applied to, for example, a semiconductor integrated circuit device or the like obtained by having both a power MOSFET and a control circuit on one chip. Such a composite device is also embraced in "power MOSFET" in the present application.

It is needless to say that an IPM (intelligent power module) having a power MOSFET and a control circuit device incorporated in one package is embraced in the "power MOSFET" in the present application.

In this example, a planar type power MOSFET formed on a silicon-based semiconductor substrate and having a source drain withstand voltage of about 600V will be described specifically as an example (the planar type power MOSFET will be the same in the following sections). It is needless to say that this description can also be applied to power MOSFETs and other devices having another withstand voltage.

The planar gate type power MOSFET which will be described in this section is slightly disadvantageous from the standpoint of on resistance compared with a trench gate type power MOSFET, but has the advantage that its high withstand voltage structure can be manufactured easily and it has good switching characteristics. It is therefore used particularly frequently for high withstand voltage exceeding 400V (withstand voltage of from about 400 to 1200 V).

In the specific description herein, an N channel type device will mainly be taken as an example. It is needless to say that the description can also be applied to a P channel type device.

Main application of the power MOSFET in this example is for motor driving. It is needless to say that the common application range of this power MOSFET includes not only it but also voice coil driving, another motion control, another inverter, and the like.

Figure 2:
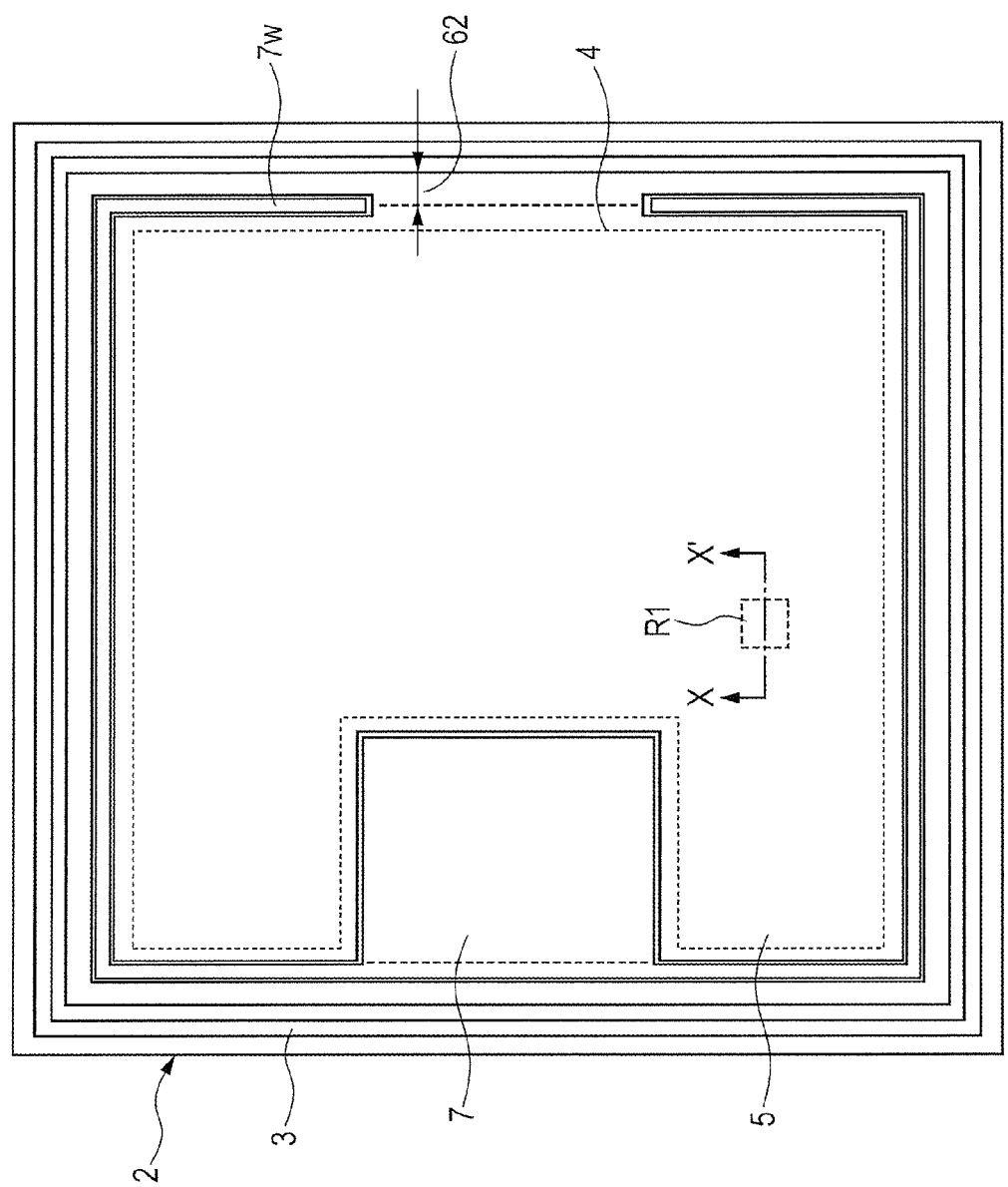
FIG. 2 is an entire top view of a semiconductor chip for describing the device structure of the vertical planar power MOSFET according to First embodiment of the present application.
Figure 3:
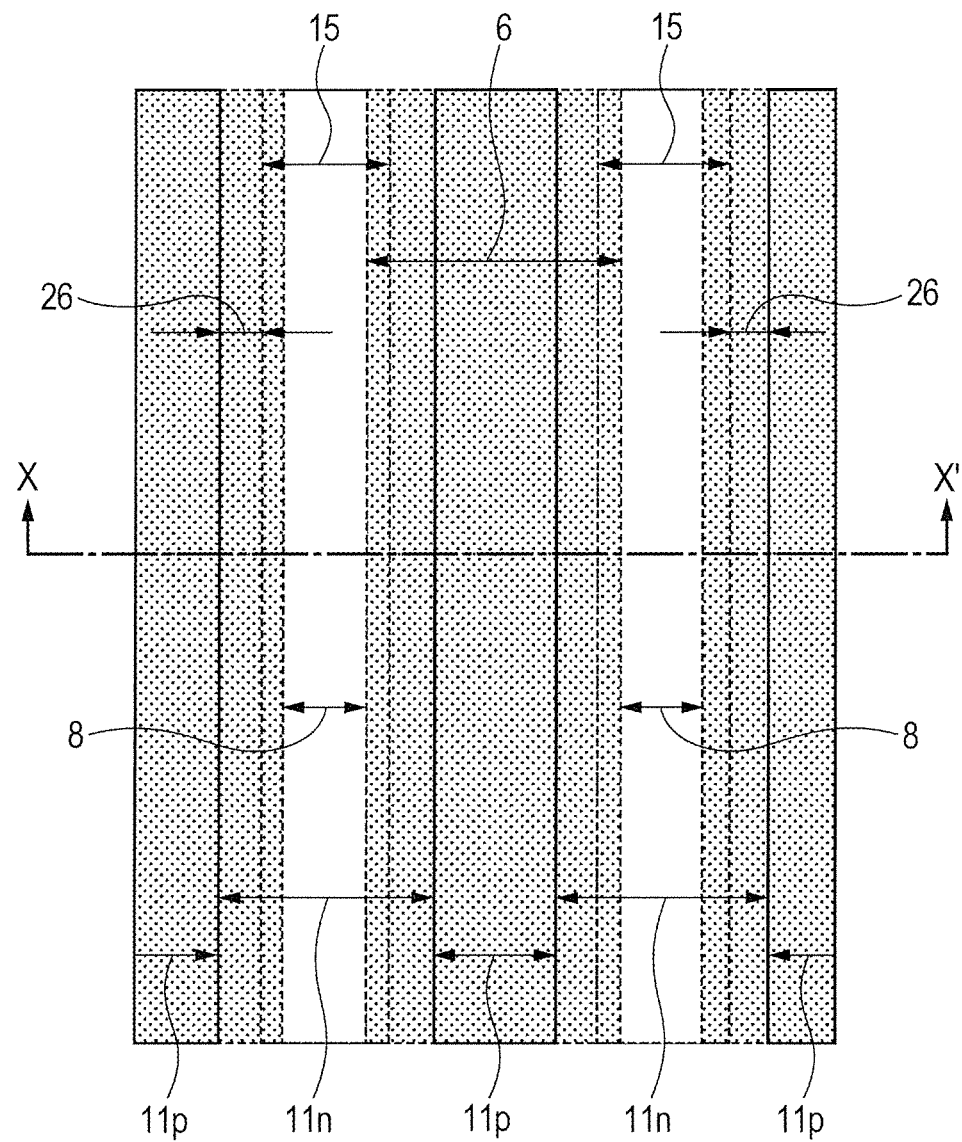
FIG. 3 is an enlarged top view of a cell portion cutout region R1 of FIG. 2.
Figure 4:
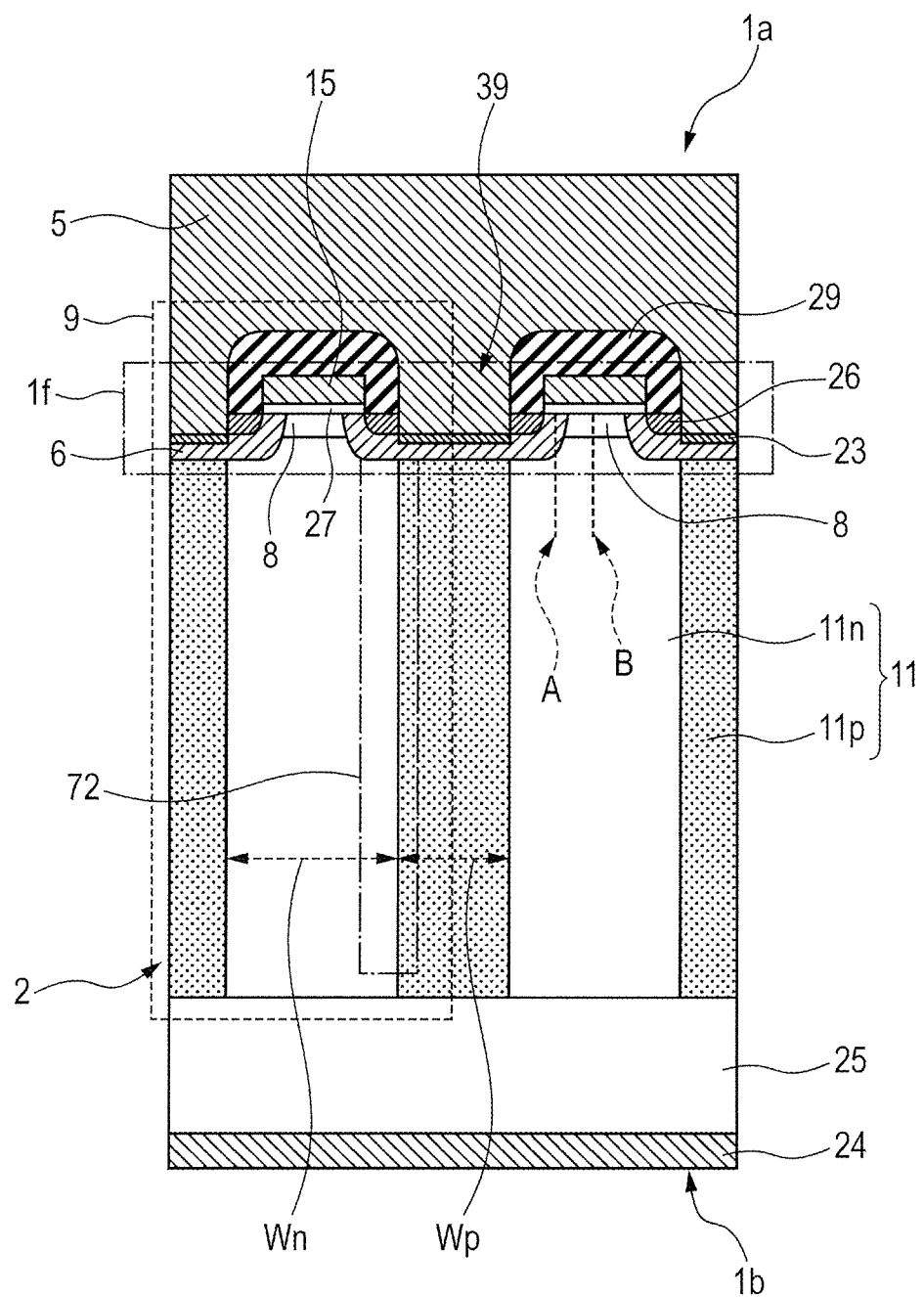
FIG. 4 is a device cross-sectional view of the X-X' cross-section of FIG. 3.

FIG. 2 is an entire top view of a semiconductor chip for describing the device structure of the vertical planar power MOSFET according to First Embodiment of the present application. FIG. 3 is an enlarged top view of a cell portion cutout region R1 of FIG. 2. FIG. 4 is a device cross-sectional view of the X-X' cross-section of FIG. 3. Referring to these drawings, the device structure and the like of the vertical planar power MOSFET according to First Embodiment of the present application will be described.

First, one example of a specific layout of the top surface of a chip (generally, several mm square) will be described. As shown in FIG. 2, in a power MOSFET element chip 2 having an element on a square or rectangular plate-shaped silicon-based semiconductor substrate, a metal source electrode 5 (for example, an aluminum-based electrode) at the center portion occupies a major area. The metal source electrode 5 has thereunder a cell region 4.

The cell region 4 has, at the periphery thereof, an aluminum-based metal guard ring 3. The aluminum-based metal guard ring 3 and the metal source electrode 5 have therebetween a metal gate electrode 7 and a metal gate wire 7w for extracting a polysilicon gate electrode to the outside. In this example, the metal source electrode 5 has, as the outermost portion thereof, a metal field plate 62 of a source potential.

Next, an enlarged plan view of the cell portion cutout region R1 of FIG. 2 is shown in FIG. 3 to describe a two-dimensional positional relationship. As shown in FIG. 3, in a planar view, a columnar N type drift region 11n (columnar first conductivity type drift region or N column region) and a columnar P type drift region 11p (columnar second conductivity type drift region or P column region) are laid alternately on almost the entire surface of the cell region 4 (FIG. 2). Each of the columnar N type drift regions 11n has, at almost the center portion thereof, a polysilicon gate electrode 15 (gate electrode or polysilicon film) and this polysilicon gate electrode 15 and the columnar P type drift region 11p have therebetween an N+ type source region 26 (source region). In the entirety of each of the columnar P type drift regions 11p and a region exceeding the boundary on both sides of the columnar P type drift region and reaching the polysilicon gate electrode 15, there is provided a P type body region 6 (a body region having a second conductivity type).

An undergate heavily doped N type region 8 (an undergate heavily doped N type region having a first conductivity type) is provided at a position under each of the polysilicon gate electrodes 15 and at almost the center portion of the polysilicon gate electrode 15 between a pair of the P type body regions 6 adjacent to both sides of the polysilicon gate electrode. In this example, the gate electrode 15 is provided on almost the entire surface of a portion facing to the undergate heavily doped N type region 8. The term "almost the entire surface" is used herein since at the end portion of the gate electrode 15 or the like, the structure is often different from that at the center portion of the cell region because of the reason of its function or process. Even if an area of a portion having no gate electrode accounts for less than about 20%, the term "entire surface" embraces such a state.

The depth Dh (FIG. 23) of the undergate heavily doped N type region 8 is set shallower than the depth Db (FIG. 23) of the P type body region 6 and the impurity concentration Nh (FIG. 23) of the undergate heavily doped N type region 8 is set higher than the impurity concentration Nd (FIG. 23) of the columnar N type drift region 11n. This makes it possible to suppress occurrence of ringing while maintaining high-speed switching characteristics (refer to Sub-section (3) of Section 4 for details).

In this example, the impurity concentration Nh (FIG. 23), that is, an N type impurity concentration, of the undergate heavily doped N type region 8 is set higher than the P type impurity concentration of the columnar P type drift region 11p, which is not always necessary but can reduce the influence of the P type impurity from the columnar P type drift region 11p adjacent to the undergate heavily doped N type region. In addition, in this example, the impurity concentration Nh (FIG. 23), that is, an N type impurity concentration, of the undergate heavily doped N type region 8 is set lower than that of the P type impurity concentration of the P type body region 6, which is however not always necessary but can prevent undesired reversal of the P type body region 6. In addition, it facilitates an introduction process of the undergate heavily doped N type region 8.

Next, the X-X' cross-section of FIG. 3 is shown in FIG. 4. As shown in FIG. 4, an N+ drain region 25 (N type single crystal silicon substrate) on the back surface 1b of the chip 2 has, on the surface thereof, a metal back-surface drain electrode 24 and the N+ drain region 25 has thereabove a drift region 11. This drift region 11 is comprised of an N column 11n (columnar N type drift region) and a P column 11p (columnar P type drift region). The drift region 11 has, in the surface region thereof, a P body region 6 and the P body region 6 has therein an N+ source region 26, a P+ body contact region 23, and the like. A pair of the N+ source regions 26 has, on the semiconductor surface therebetween, a polysilicon gate electrode 15 (a gate electrode or a polysilicon film) via a gate insulating film 27. This polysilicon gate electrode 15 has thereon an interlayer insulating film 29. Described specifically, the gate electrode 15 is provided in a surface region 1f of the semiconductor chip 2 (semiconductor substrate) on the side of the device surface 1a (first main surface) and on the surface of the columnar N type drift region 11n (columnar first conductivity type drift region or N column region) via a gate insulating film.

This interlayer insulating film 29 has thereon an aluminum-based electrode film such as a metal source electrode 5 and is electrically coupled to the N+ drain region 25 and the P+ body contact region 23 via a substrate contact trench 39. In a region sandwiched with a pair of the body regions adjacent to each other in the surface of the columnar N type drift region 11n under the gate electrode 15, there is provided an undergate heavily doped N type region 8.

FIG. 4 includes two cells of a MOSFET unit cell portion 9 and they have, as a portion thereof, a body diode portion 72.

In this example, the width Wn of the N column region 11n in a patterning level is, for example, about 6 μm and the width of the P column region 11p is, for example, about 4 μm (this means that the pitch of a super junction is about 10 μm).

3. Description on One Example of a Main Part of a Manufacturing Process of the Device Structure of the Vertical Planar Power MOSFET According to First Embodiment of the Present Application (Mainly from FIG. 5 to FIG. 22)

This Section shows one example of the main part of a manufacturing process of the device structure described in Section 2. Needless to say, it is one example and can be modified in various ways.

Figure 5:
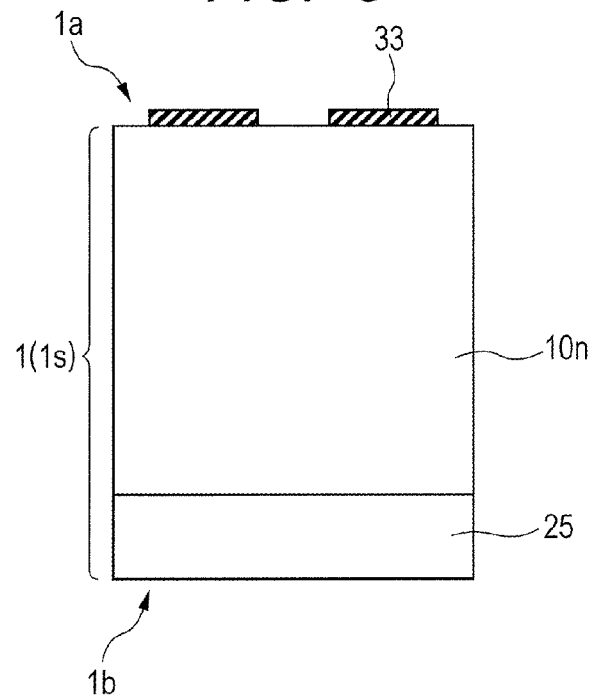
FIG. 5 is a device cross-sectional view during a manufacturing process (at the time of completion of processing of a trench processing hardmask film) of a portion corresponding to FIG. 4 for describing one example of the main part of the manufacturing process corresponding to the device structure of the vertical planar power MOSFET according to First Embodiment of the present application.
Figure 6:
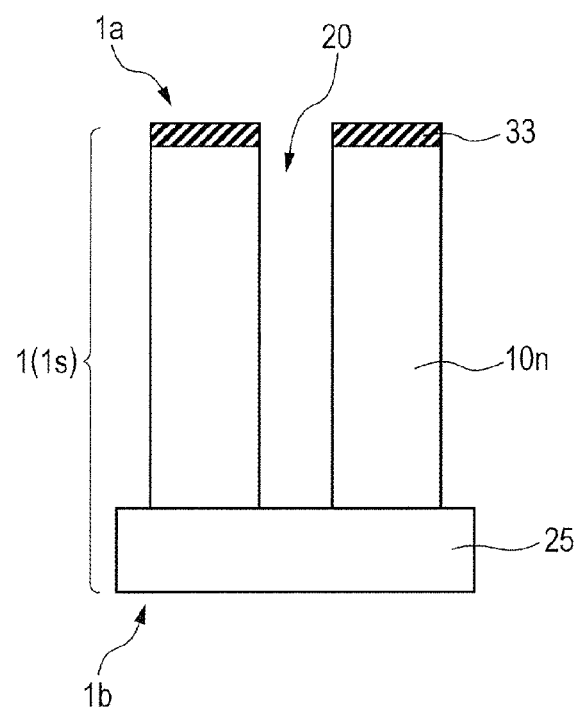
FIG. 6 is a device cross-sectional view during the manufacturing process (at the time of completion of trench processing) of the portion corresponding to FIG. 4 for describing the one example of the main part of the manufacturing process corresponding to the device structure of the vertical planar power MOSFET according to First Embodiment of the present application.
Figure 7:
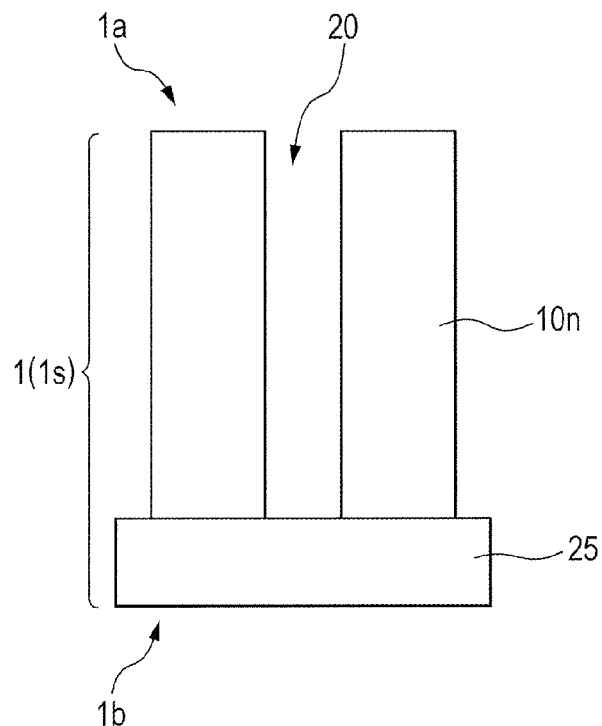
FIG. 7 is a device cross-sectional view during the manufacturing process (at the time of completion of removal of the trench processing hardmask film) of the portion corresponding to FIG. 4 for describing the one example of the main part of the manufacturing process corresponding to the device structure of the vertical planar power MOSFET according to First Embodiment of the present application.
Figure 8:
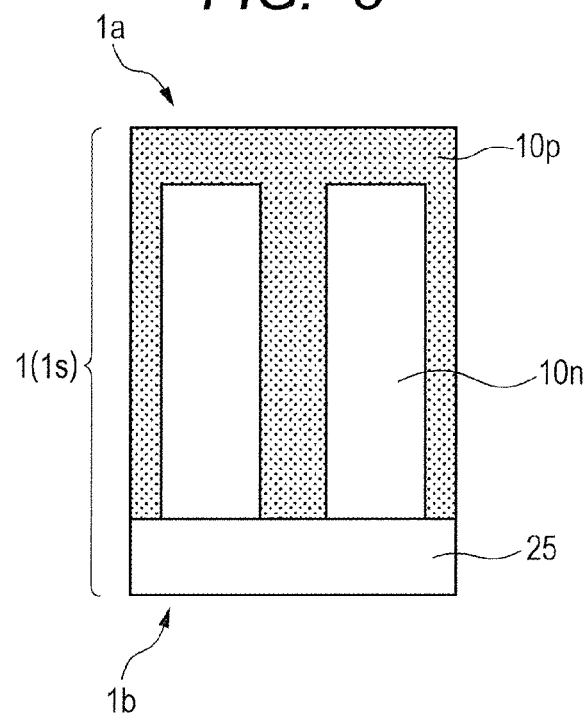
FIG. 8 is a device cross-sectional view during the manufacturing process (at the time of completion of buried epitaxial growth) of the portion corresponding to FIG. 4 for describing the one example of the main part of the manufacturing process corresponding to the device structure of the vertical planar power MOSFET according to First Embodiment of the present application.
Figure 9:
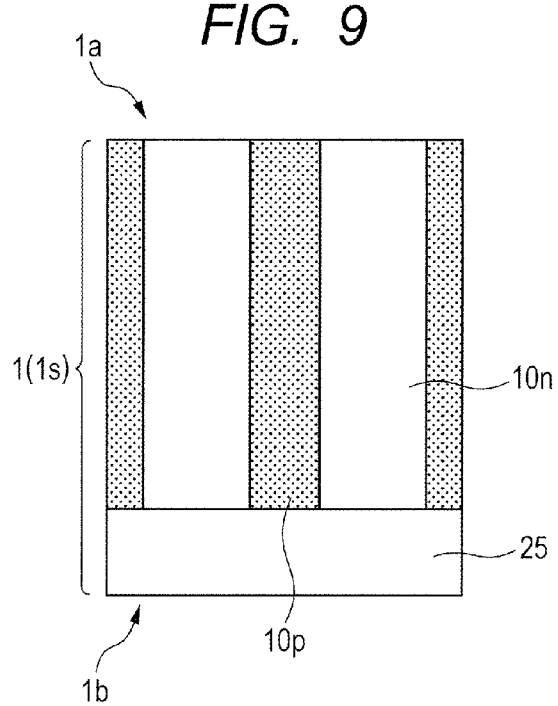
FIG. 9 is a device cross-sectional view during the manufacturing process (at the time of completion of planarization after buried epitaxial growth) of the portion corresponding to FIG. 4 for describing the one example of the main part of the manufacturing process corresponding to the device structure of the vertical planar power MOSFET according to First Embodiment of the present application.
Figure 10:
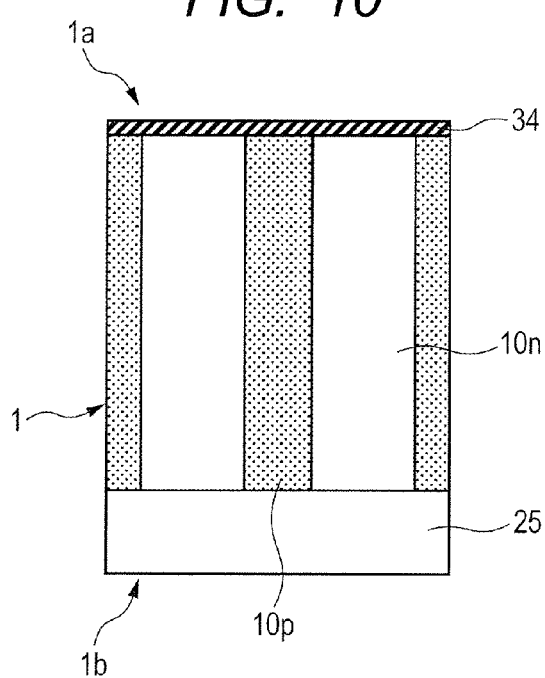
FIG. 10 is a device cross-sectional view during the manufacturing process (at the time of completion of formation of a field insulating film) of the portion corresponding to FIG. 4 for describing the one example of the main part of the manufacturing process corresponding to the device structure of the vertical planar power MOSFET according to First Embodiment of the present application.
Figure 11:
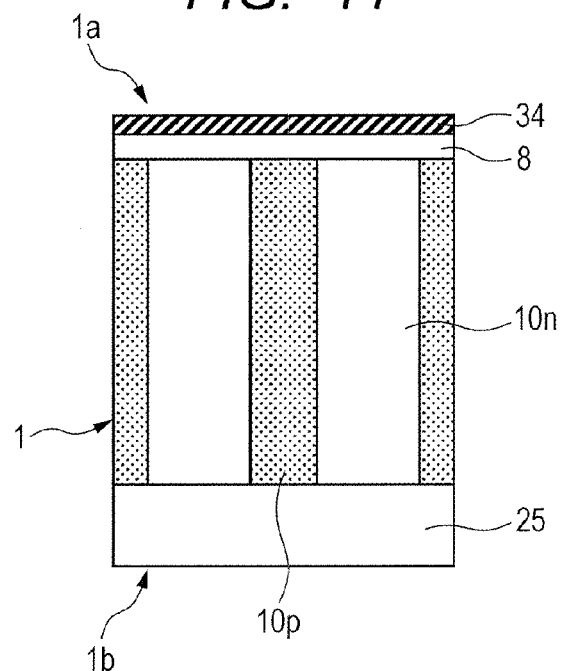
FIG. 11 is a device cross-sectional view during the manufacturing process (at the time of completion of introduction of an undergate heavily doped N type region) of the portion corresponding to FIG. 4 for describing the one example of the main part of the manufacturing process corresponding to the device structure of the vertical planar power MOSFET according to First Embodiment of the present application.
Figure 12:
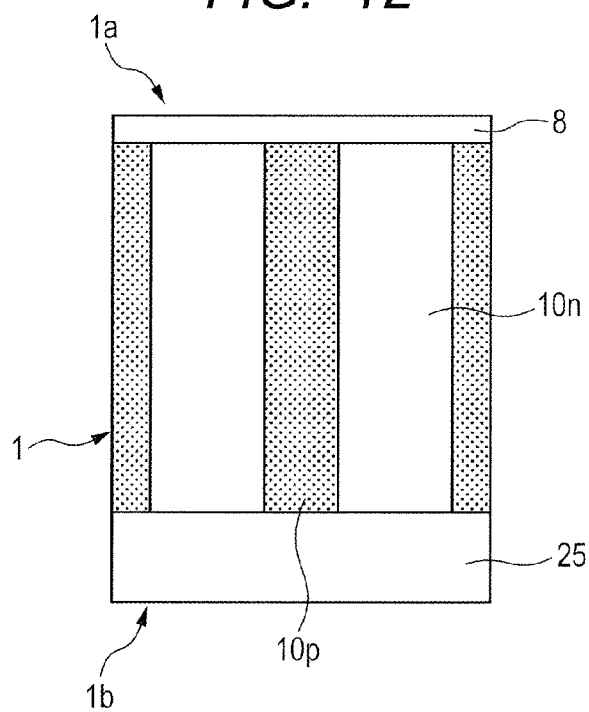
FIG. 12 is a device cross-sectional view during the manufacturing process (at the time of completion of removal of a field insulating film from a cell region and therearound) of the portion corresponding to FIG. 4 for describing the one example of the main part of the manufacturing process corresponding to the device structure of the vertical planar power MOSFET according to First Embodiment of the present application.
Figure 13:
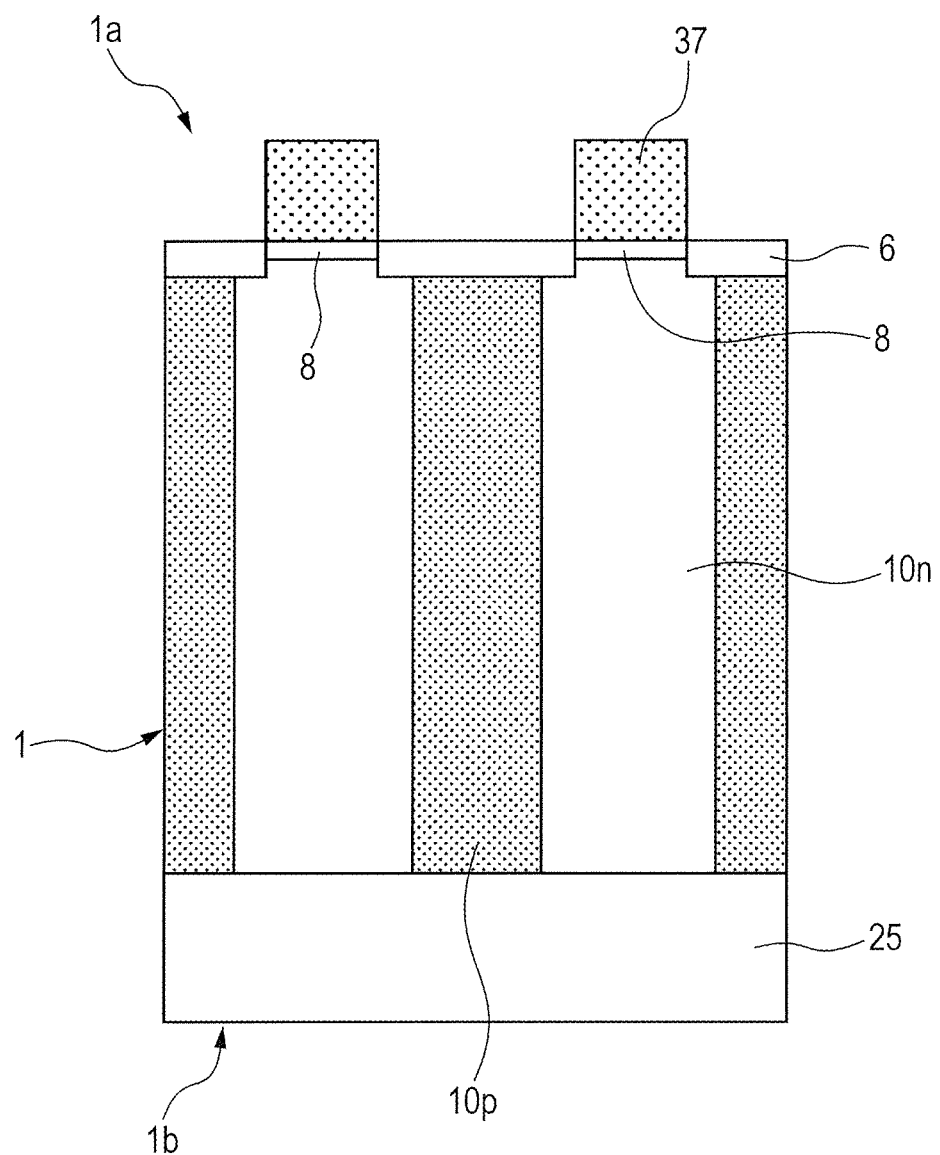
FIG. 13 is a device cross-sectional view during the manufacturing process (at the time of completion of introduction of a P type body region) of the portion corresponding to FIG. 4 for describing the one example of the main part of the manufacturing process corresponding to the device structure of the vertical planar power MOSFET according to First Embodiment of the present application.
Figure 14:
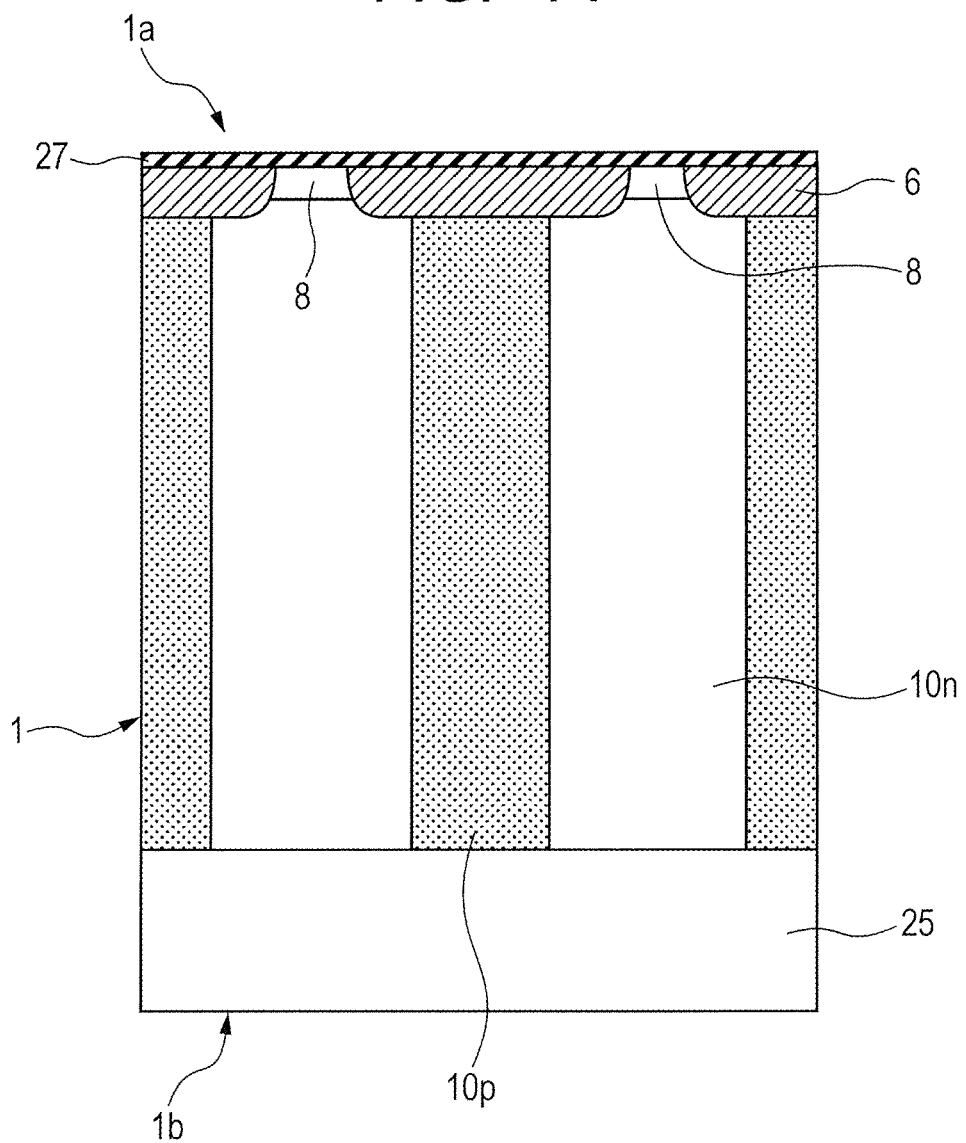
FIG. 14 is a device cross-sectional view during the manufacturing process (at the time of completion of diffusion of the P type body region and formation of a gate insulating film) of the portion corresponding to FIG. 4 for describing the one example of the main part of the manufacturing process corresponding to the device structure of the vertical planar power MOSFET according to First Embodiment of the present application.
Figure 15:
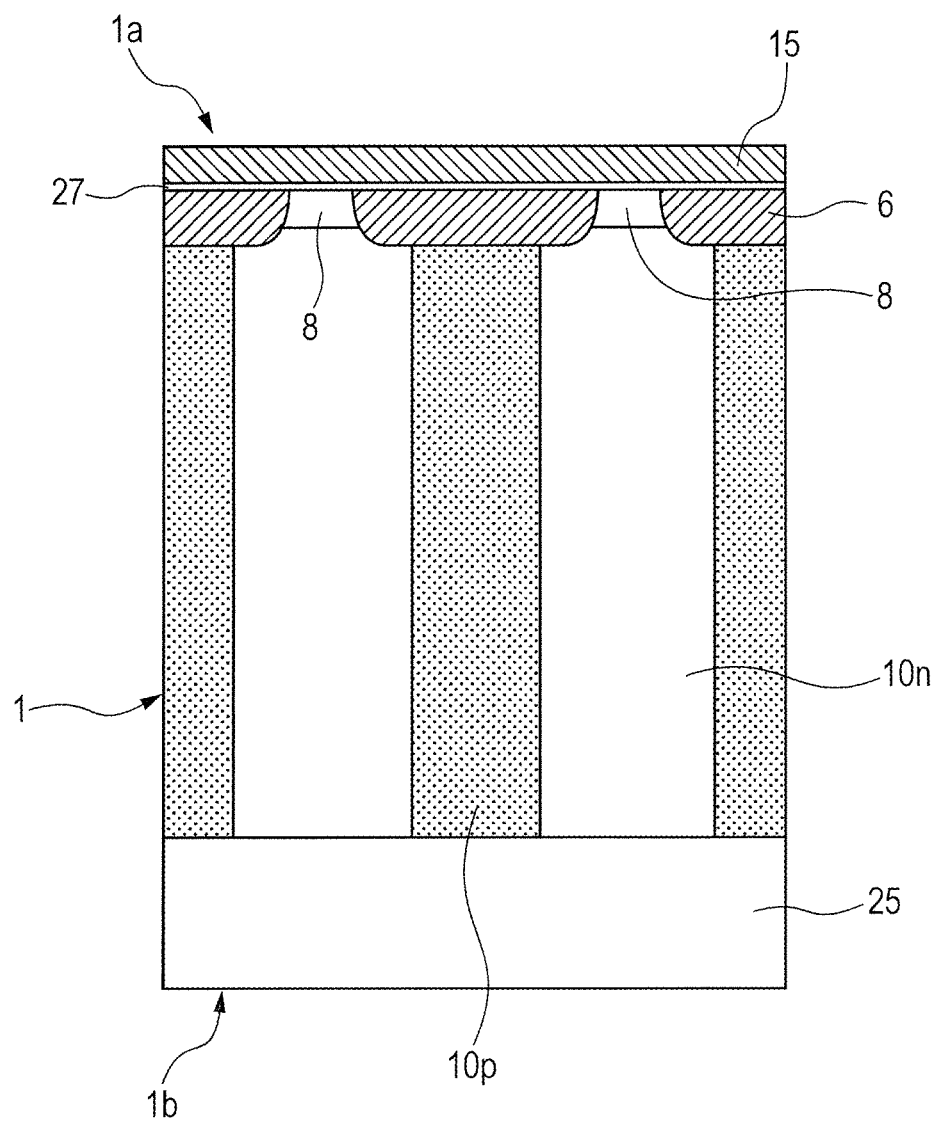
FIG. 15 is a device cross-sectional view during the manufacturing process (at the time of completion of formation of a gate polysilicon film) of the portion corresponding to FIG. 4 for describing the one example of the main part of the manufacturing process corresponding to the device structure of the vertical planar power MOSFET according to First Embodiment of the present application.
Figure 16:
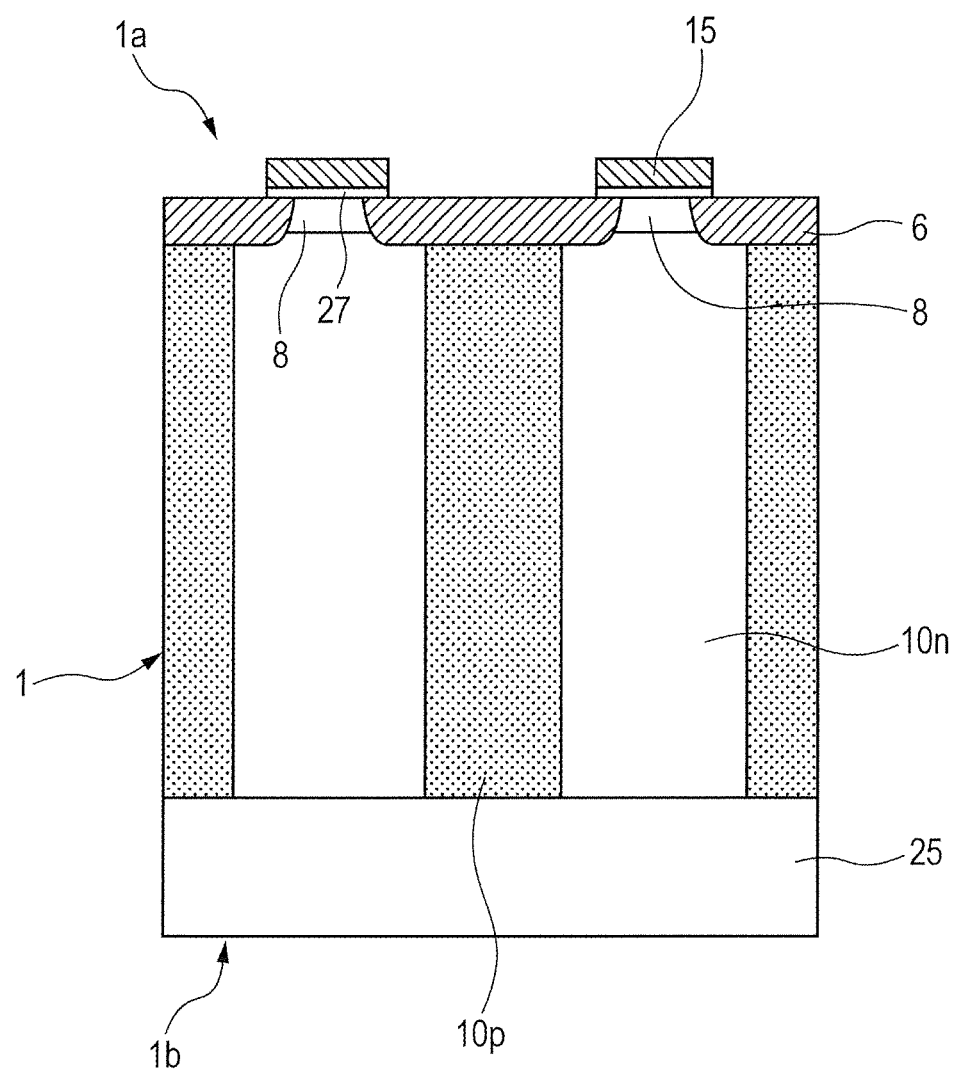
FIG. 16 is a device cross-sectional view during the manufacturing process (at the time of completion of gate processing) of the portion corresponding to FIG. 4 for describing the one example of the main part of the manufacturing process corresponding to the device structure of the vertical planar power MOSFET according to First Embodiment of the present application.
Figure 17:
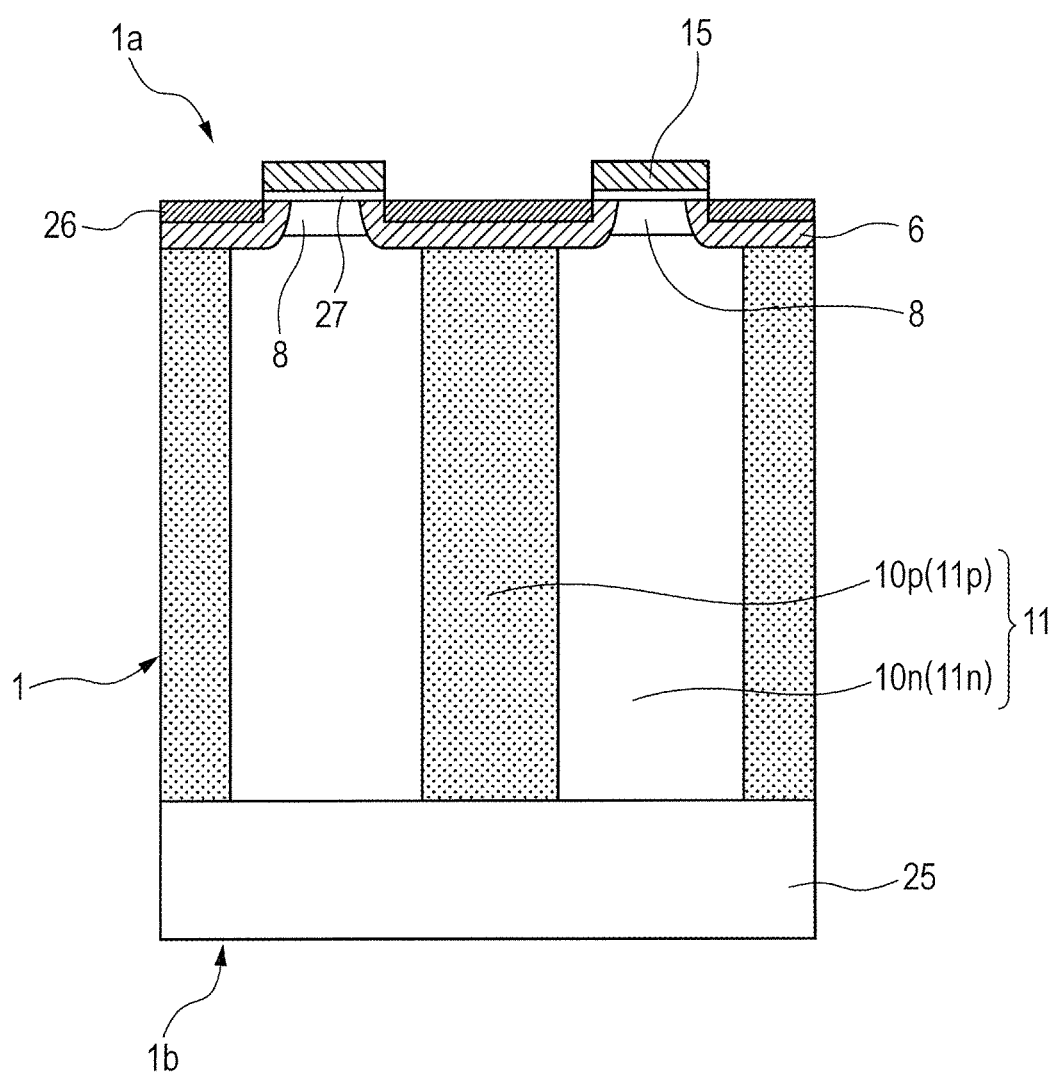
FIG. 17 is a device cross-sectional view during the manufacturing process (at the time of completion of introduction of an N+ type source region) of the portion corresponding to FIG. 4 for describing the one example of the main part of the manufacturing process corresponding to the device structure of the vertical planar power MOSFET according to First Embodiment of the present application.
Figure 18:
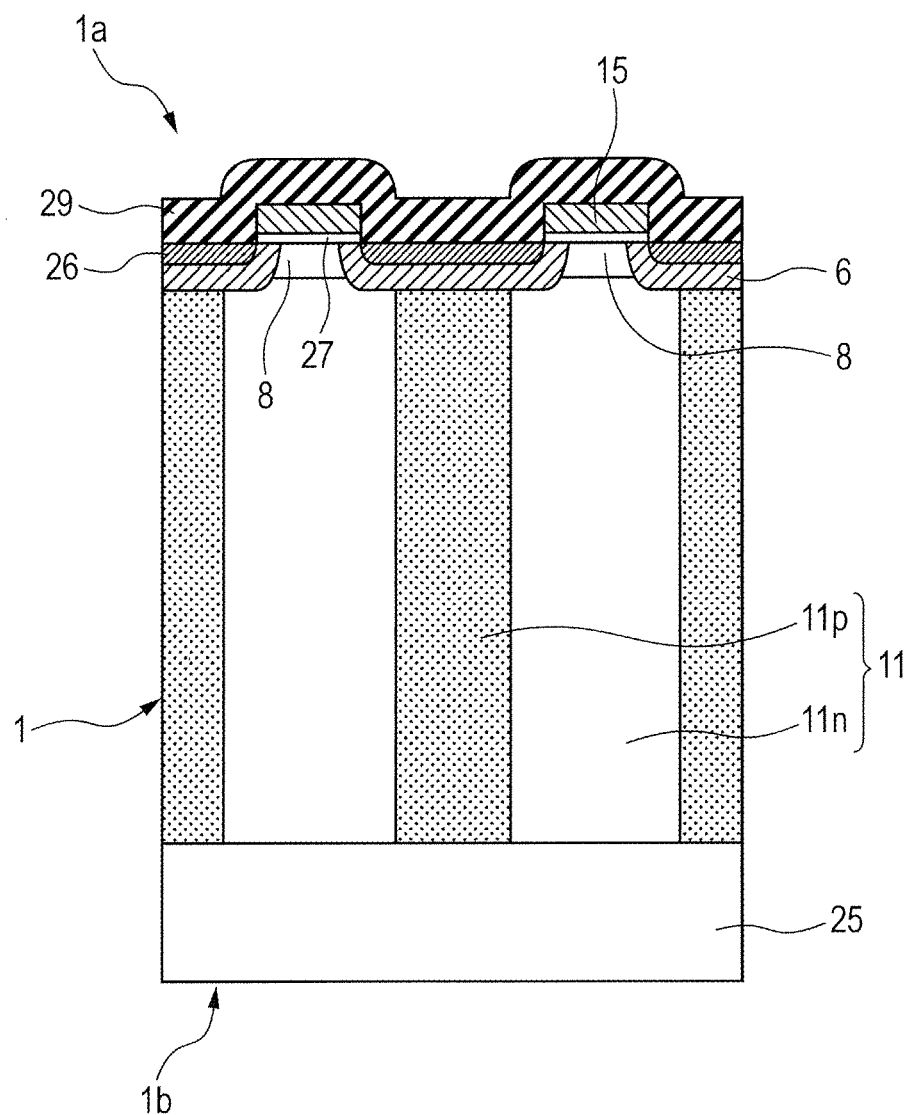
FIG. 18 is a device cross-sectional view during the manufacturing process (at the time of completion of formation of an interlayer insulating film) of the portion corresponding to FIG. 4 for describing the one example of the main part of the manufacturing process corresponding to the device structure of the vertical planar power MOSFET according to First Embodiment of the present application.
Figure 19:
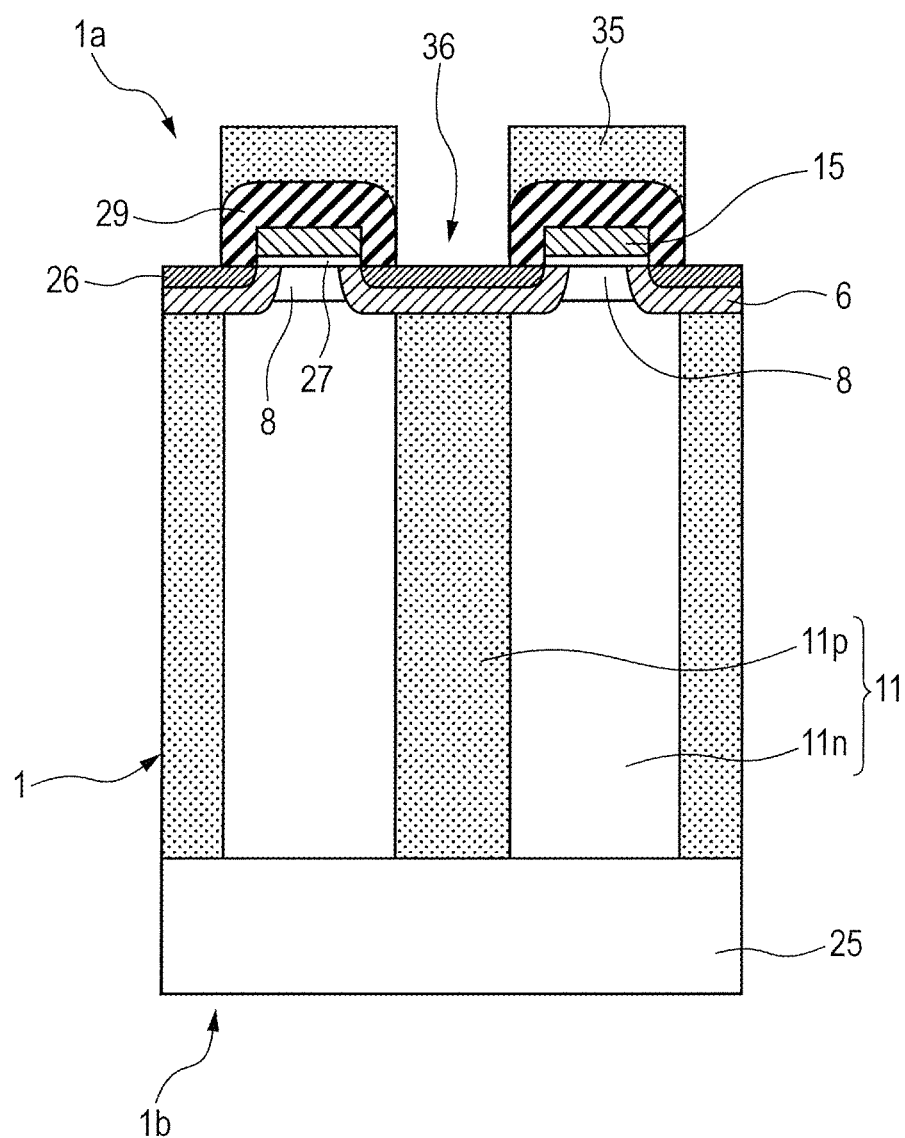
FIG. 19 is a device cross-sectional view during the manufacturing process (at the time of completion of formation of a contact opening) of the portion corresponding to FIG. 4 for describing the one example of the main part of the manufacturing process corresponding to the device structure of the vertical planar power MOSFET according to First Embodiment of the present application.
Figure 20:
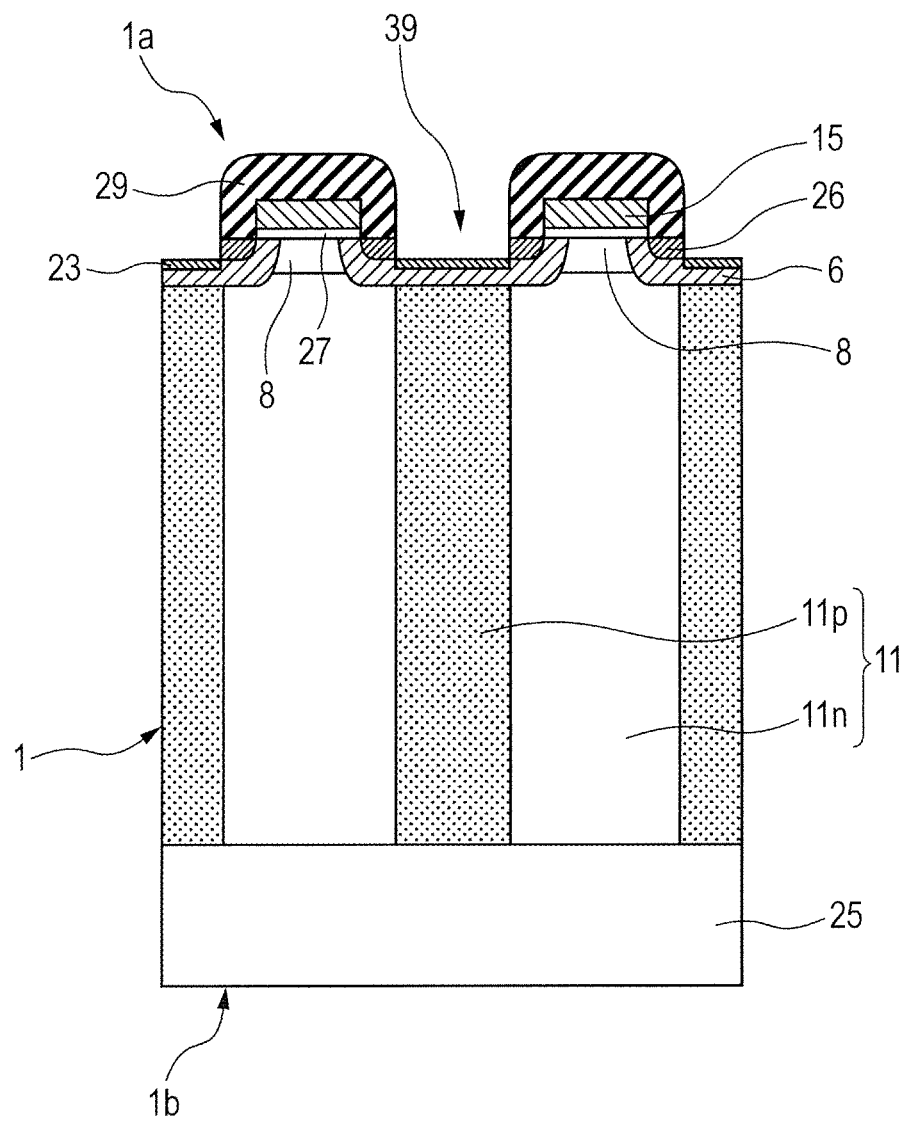
FIG. 20 is a device cross-sectional view during the manufacturing process (at the time of completion of formation of a substrate contact trench and introduction of a P+ type body contact region) of the portion corresponding to FIG. 4 for describing the one example of the main part of the manufacturing process corresponding to the device structure of the vertical planar power MOSFET according to First Embodiment of the present application.
Figure 21:
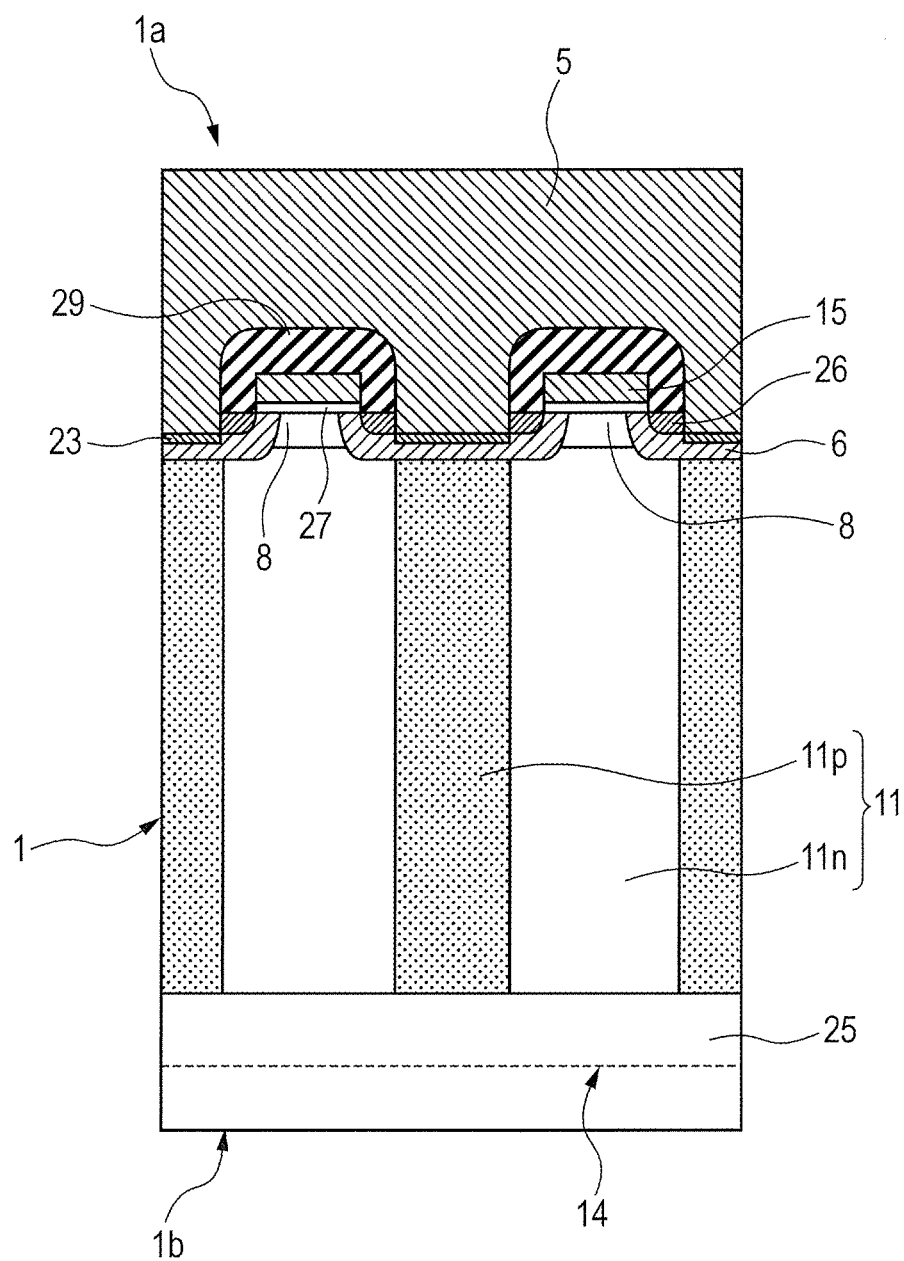
FIG. 21 is a device cross-sectional view during a manufacturing process (at the time of completion of formation of a metal source electrode and the like) of the portion corresponding to FIG. 4 for describing the one example of the main part of the manufacturing process corresponding to the device structure of the vertical planar power MOSFET according to First Embodiment of the present application.
Figure 22:
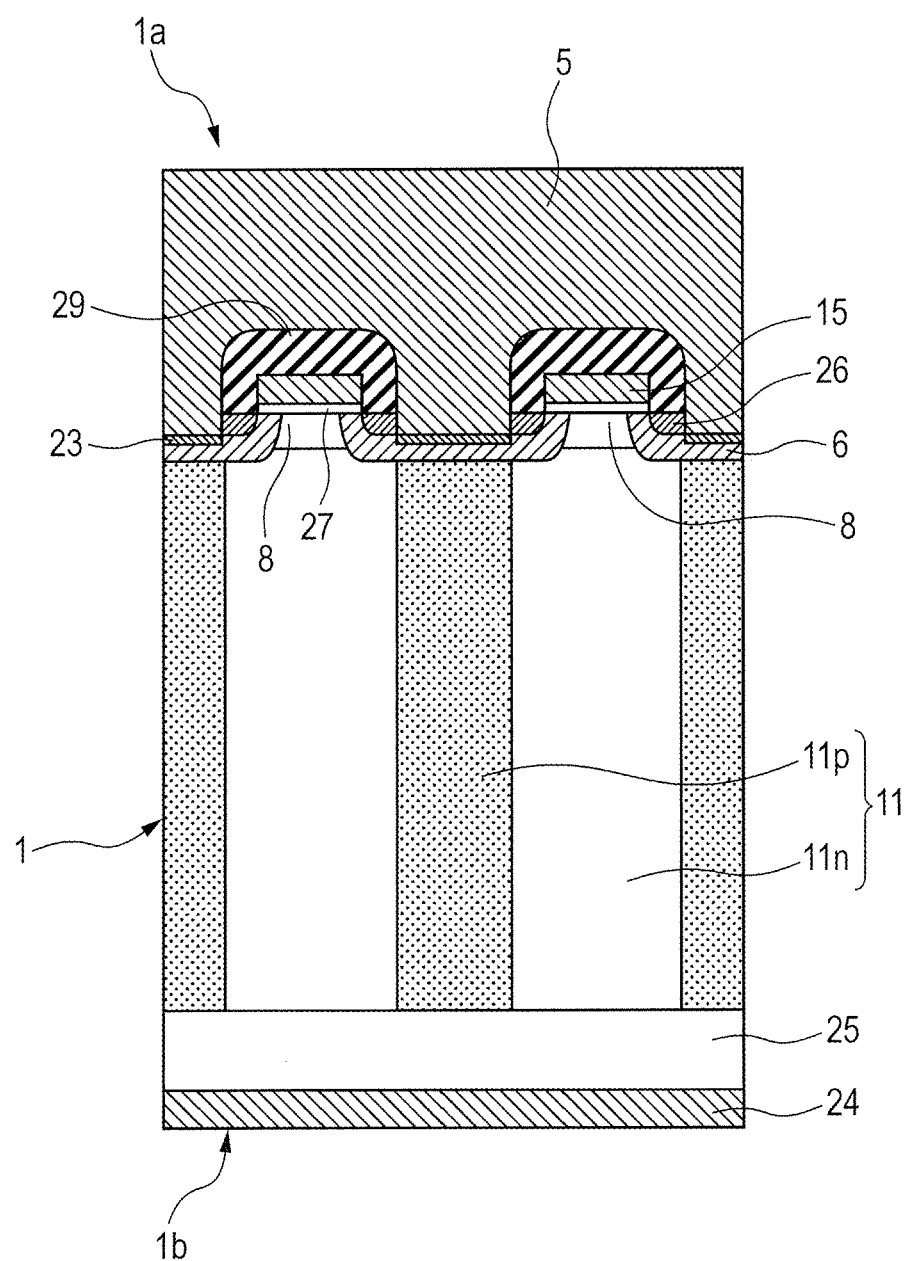
FIG. 22 is a device cross-sectional view during the manufacturing process (at the time of completion of back grinding and formation of a back-surface metal electrode) of the portion corresponding to FIG. 4 for describing the one example of the main part of the manufacturing process corresponding to the device structure of the vertical planar power MOSFET according to First Embodiment of the present application.

FIG. 5 is a device cross-sectional view during a manufacturing process (at the time of completion of processing of a trench processing hardmask film) of a portion corresponding to FIG. 4 for describing one example of the main part of the manufacturing process corresponding to the device structure of the vertical planar power MOSFET according to First Embodiment of the present application. FIG. 6 is a device cross-sectional view during the manufacturing process (at the time of completion of trench processing) of the portion corresponding to FIG. 4 for describing the one example of the main part of the manufacturing process corresponding to the device structure of the vertical planar power MOSFET according to First Embodiment of the present application. FIG. 7 is a device cross-sectional view during the manufacturing process (at the time of completion of removal of the trench processing hardmask film) of the portion corresponding to FIG. 4 for describing the one example of the main part of the manufacturing process corresponding to the device structure of the vertical planar power MOSFET according to First Embodiment of the present application. FIG. 8 is a device cross-sectional view during the manufacturing process (at the time of completion of buried epitaxial growth) of the portion corresponding to FIG. 4 for describing the one example of the main part of the manufacturing process corresponding to the device structure of the vertical planar power MOSFET according to First Embodiment of the present application. FIG. 9 is a device cross-sectional view during the manufacturing process (at the time of completion of planarization after buried epitaxial growth) of the portion corresponding to FIG. 4 for describing the one example of the main part of the manufacturing process corresponding to the device structure of the vertical planar power MOSFET according to First Embodiment of the present application. FIG. 10 is a device cross-sectional view during the manufacturing process (at the time of completion of formation of a field insulating film) of the portion corresponding to FIG. 4 for describing the one example of the main part of the manufacturing process corresponding to the device structure of the vertical planar power MOSFET according to First Embodiment of the present application. FIG. 11 is a device cross-sectional view during the manufacturing process (at the time of completion of introduction of an undergate heavily doped N type region) of the portion corresponding to FIG. 4 for describing the one example of the main part of the manufacturing process corresponding to the device structure of the vertical planar power MOSFET according to First Embodiment of the present application. FIG. 12 is a device cross-sectional view during the manufacturing process (at the time of completion of removal of a field insulating film from a cell region and therearound) of the portion corresponding to FIG. 4 for describing the one example of the main part of the manufacturing process corresponding to the device structure of the vertical planar power MOSFET according to First Embodiment of the present application. FIG. 13 is a device cross-sectional view during the manufacturing process (at the time of completion of introduction of a P type body region) of the portion corresponding to FIG. 4 for describing the one example of the main part of the manufacturing process corresponding to the device structure of the vertical planar power MOSFET according to First Embodiment of the present application. FIG. 14 is a device cross-sectional view during the manufacturing process (at the time of completion of diffusion of the P type body region and formation of a gate insulating film) of the portion corresponding to FIG. 4 for describing the one example of the main part of the manufacturing process corresponding to the device structure of the vertical planar power MOSFET according to First Embodiment of the present application. FIG. 15 is a device cross-sectional view during the manufacturing process (at the time of completion of formation of a gate polysilicon film) of the portion corresponding to FIG. 4 for describing the one example of the main part of the manufacturing process corresponding to the device structure of the vertical planar power MOSFET according to First Embodiment of the present application. FIG. 16 is a device cross-sectional view during the manufacturing process (at the time of completion of gate processing) of the portion corresponding to FIG. 4 for describing the one example of the main part of the manufacturing process corresponding to the device structure of the vertical planar power MOSFET according to First Embodiment of the present application. FIG. 17 is a device cross-sectional view during the manufacturing process (at the time of completion of introduction of an N+ type source region) of the portion corresponding to FIG. 4 for describing the one example of the main part of the manufacturing process corresponding to the device structure of the vertical planar power MOSFET according to First Embodiment of the present application. FIG. 18 is a device cross-sectional view during the manufacturing process (at the time of completion of formation of an interlayer insulating film) of the portion corresponding to FIG. 4 for describing the one example of the main part of the manufacturing process corresponding to the device structure of the vertical planar power MOSFET according to First Embodiment of the present application. FIG. 19 is a device cross-sectional view during the manufacturing process (at the time of completion of formation of a contact opening) of the portion corresponding to FIG. 4 for describing the one example of the main part of the manufacturing process corresponding to the device structure of the vertical planar power MOSFET according to First Embodiment of the present application. FIG. 20 is a device cross-sectional view during the manufacturing process (at the time of completion of formation of a substrate contact trench and introduction of a P+ type body contact region) of the portion corresponding to FIG. 4 for describing the one example of the main part of the manufacturing process corresponding to the device structure of the vertical planar power MOSFET according to First Embodiment of the present application. FIG. 21 is a device cross-sectional view during a manufacturing process (at the time of completion of formation of a metal source electrode and the like) of the portion corresponding to FIG. 4 for describing the one example of the main part of the manufacturing process corresponding to the device structure of the vertical planar power MOSFET according to First Embodiment of the present application. FIG. 22 is a device cross-sectional view during the manufacturing process (at the time of completion of back grinding and formation of a back-surface metal electrode) of the portion corresponding to FIG. 4 for describing the one example of the main part of the manufacturing process corresponding to the device structure of the vertical planar power MOSFET according to First Embodiment of the present application. Based on them, the one example of the main part of the manufacturing process corresponding to the device structure of the vertical planar power MOSFET according to First Embodiment of the present application will be described.

First, as shown in FIG. 5, an N type silicon single crystal substrate 25 (having a wafer diameter of, for example, 200ϕ, which may be 150ϕ, 300ϕ, or 450ϕ instead) doped with antimony (for example, on the order of from about $10^{18}$ to $10^{19}$/cm$^3$), that is, a semiconductor wafer 1 is provided. A phosphorus-doped N-epitaxial layer 10n (using, for example, phosphorus as a dopant and having a concentration of, for example, about 3×10$^{15}$/cm$^3$, which region will be an N type drift region 11n later) having a thickness of from about 45 to 50 μm is formed to obtain an epitaxial substrate is (1). On the device surface 1a (main surface opposite to the back surface 1b) of this semiconductor wafer 1, a hardmask 33 (having a thickness of, for example, about 1.5 μm to 2 μm) for forming a P type-column forming trench is formed using, for example, P-TEOS (plasma-tetraethyl orthosilicate) or the like.

Next, as shown in FIG. 6, with the hardmask 33 for forming a P type-column forming trench as a mask, the N epitaxial layer 10n and the like are anisotropically dry etched to form a P type column forming trench 20. Dry etching is conducted, for example, in an atmosphere containing Ar, SF$_6$, O$_2$ or the like as a principal gas component. Dry etching depth is preferably from about 40 to 55 μm. The P type column forming trench 20 preferably reaches the N type silicon single crystal substrate 25. The trench however does not necessarily reach the substrate and it may come close to the substrate.

Next, as shown in FIG. 7, the hardmask 33 which has become unnecessary is removed using wet etching or the like, for example, with a hydrofluoric acid-based etching solution or the like.

Next, as shown in FIG. 8, burying epitaxial growth (in-trench epitaxial burying method) of the P type column forming trench 20 is conducted to form a P type buried epitaxial layer 10p (having a concentration, for example, on the order of about 10$^{15}$/cm$^3$ by using boron as a dopant). This P type epitaxial region 10p will be a portion to be a P type drift region 11p. Burying epitaxial growth is conducted, for example, under the following conditions: processing pressure: for example, from about 1.3×10$^4$ Pascal to 1.0×10$^5$ Pascal and a raw material gas: silicon tetrachloride, trichlorosilane, dichlorosilane, monosilane, or the like.

Next, as shown in FIG. 9, a planarization step such as CMP (chemical mechanical polishing) is conducted to remove the P type buried epitaxial layer 10p outside the P type column forming trench 20 and at the same time, planarize the surface 1a of the semiconductor wafer 1. The super junction structure as shown in FIG. 9 may be formed using a multi epitaxial method instead of a trench fill method.

Next, as shown in FIG. 10, a silicon oxide film 34 (field insulating film) is formed on almost the entire surface of the surface 1a of the semiconductor wafer 1 by thermal oxidation. The field insulating film 34 has a thickness of, for example, about 350 nm.

Next, as shown in FIG. 11, an undergate heavily doped N type region introducing resist film is formed on the device main surface 1a (first main surface) of the wafer 1 by using conventional lithography. Then, with this resist film as a mask, ion implantation is conducted to introduce an undergate heavily doped N type region 8. This ion implantation is conducted under the following conditions: ion specifies: phosphorus, implantation energy: for example, about 200 keV, dosage: for example, on the order of about 10$^{12}$/cm$^2$ (for example, about 1×10$^{17}$/cm$^3$ in terms of concentration, preferably ranging from about 3×10$^{16}$/cm$^3$ to about 2×10$^{17}$/cm$^3$). A region (which will be called "undergate heavily doped N type region forming impurity introduction region") in which an N type impurity (first conductivity type impurity) for forming this undergate heavily doped N type region 8 corresponds to almost the entirety of the cell region 4 in this example (which will be called "cell entire region introduction"). The term "almost entire region" is used because it is not always necessary to completely allow the cell region 4 to coincide with the region in which the N type impurity (first conductivity type impurity) for forming the undergate heavily doped N type region 8 (for example, the term "entire region" embraces a difference in area within 20%) is introduced. The undergate heavily-doped N type region forming impurity introduction region is required to cover at least the undergate heavily doped N type region 8 and the N type impurity is not necessarily introduced into the other region. Introduction of it into almost the entire cell region 4 however makes the process easiest. Due to the relationship with the P type region (extending portion of the P type body region or the like) at the peripheral end portion of the cell region 4, however, the undergate heavily doped N type region forming impurity introduction region is sometimes slightly deviated inside or outside. In more general, the undergate heavily doped N type region forming impurity introduction region can be made wider than the region between a pair of the body regions 6 adjacent to each other, that is, the undergate heavily doped N type regions 8 (which will be called "wide area introduction" including introduction into the entire cell region). Also in this case, the process becomes more easier compared with allowing the undergate heavily doped N type region forming impurity introduction region to coincide with the undergate heavily doped N type region 8. In association with this, when the impurity concentration of the undergate heavily doped N type region 8 is made lower than the impurity concentration of the P type body region 6, it is possible to avoid undesired reversal of an impurity concentration (net doping concentration) or marked concentration decrease in the surface region or the like of the P type body region 6 even in such wide area introduction.

Then, the undergate heavily doped N type region introducing resist film which has become unnecessary is removed from the entire surface, for example, by ashing.

Next, as shown in FIG. 12, a silicon oxide etching resist film is formed on the silicon oxide film 34, for example, by conventional lithography. With this resist film as a mask, the field insulating film 34 is removed from the cell region 4 (FIG. 2) and at the periphery thereof by using, for example, dry etching with a fluorocarbon-based etching gas or the like. Then, the silicon oxide etching resist film which has become unnecessary is removed using ashing or the like from the entire surface.

Next, as shown in FIG. 13, a P body region introducing resist film 37 is formed on the surface 1a of the semiconductor wafer 1, for example, by conventional lithography (it is the common practice to form an ion implantation protecting film such as a thermal oxide film having a thickness of about 10 nm in advance on the surface 1a of the semiconductor wafer 1 but this film is omitted because it makes the drawing cumbersome, which will equally apply to the other portion). Then, with the P body region introducing resist film 37 as a mask, a P type body region 6 is introduced using ion implantation. The following are preferable ranges of the implantation conditions:

(1) first step: ion species: boron, implantation energy: for example, about 200 keV, and dosage: for example, on the order of about $10^{13}/cm^2$; and (2) first step: ion species: boron, implantation energy: for example, about 75 keV, and dosage: for example, on the order of about $10^{12}/cm^2$ (for example, on the order of about $10^{17}/cm^3$ in terms of concentration). Then, the P body region introducing resist film 37 which has become unnecessary is removed from the entire surface, for example, by ashing.

Next, as shown in FIG. 14, a gate oxide film 27 (gate insulating film) is formed on the surface 1a of the semiconductor wafer 1. The thickness of the gate insulating film 27 is, for example, from about 50 nm to 200 nm, though depending on withstand voltage. The gate oxide film is formed, for example, by CVD (chemical vapor deposition) or thermal oxidation. For wafer washing prior to the gate oxidation, wet washing with, for example, a first washing liquid composed of ammonia:(hydrogen peroxide):(pure water)=1:1:5 (by volume) and a second washing liquid composed of (hydrochloric acid):(hydrogen peroxide):(pure water)=1:1:6 (by volume) can be employed.

Next, as shown in FIG. 15, a gate electrode polysilicon film 15, that is, a first-level polysilicon film (having a thickness of, for example, about 500 nm, with a preferable range of, for example, from about 200 nm to 800 nm) is formed on the gate oxide film 27, for example, by using low-pressure CVD (chemical vapor deposition).

Next, as shown in FIG. 16, dry etching (for example, in a halogen-based gas atmosphere) is conducted to pattern the polysilicon film into the gate electrode 15 and the like.

Next, as shown in FIG. 17, an N+ source region introducing resist film is formed using conventional lithography and with the resist film as a mask (in self alignment insofar as the cell region 4 is concerned), an N+ source region 26 is formed by ion implantation. The ion implantation is conducted under the following conditions: ion species: arsenic, implantation energy: for example, about 40 keV, and dosage: preferably on the order of, for example, $10^{15}/cm^2$ (for example, on the order of about $10^{20}/cm^3$ in terms of concentration). Then the N+ source region introducing resist film which has become unnecessary is removed from the entire surface by using ashing or the like. By this removal, the MOSFET has almost been completed so that the N type epitaxial region 10n and the P type epitaxial region 10p will thereafter serve as a columnar N type drift region 11n and a columnar P type drift region 11p, respectively.

Next, as shown in FIG. 18, a PSG (phospho-silicate-glass) film 29 (interlayer insulating film) is formed on almost the entire surface of the surface 1a of the semiconductor wafer 1 by using CVD or the like. The interlayer insulating film 29 may be, as well as the PSG film, a BPSG film, a TEOS film, an SOG film, an HDP (high density plasma) silicon oxide film, or a film stack of the PSG film and any of these films. The total thickness of the interlayer insulating film 29 is, for example, about 900 nm (preferably ranging from about 500 nm to 1200 nm).

Next, as shown in FIG. 19, a contact opening forming resist film 25 is formed on the surface 1a of the semiconductor wafer 1, for example, by using conventional lithography and with the resist film as a mask, dry etching (for example, in a fluorocarbon-based gas atmosphere) is conducted to make a contact opening 36 and the like. Then, the contact opening forming resist film 35 which has become unnecessary is removed from the entire surface, for example, by using asking.

Next, as shown in FIG. 20, the silicon substrate is etched (for example, dry etched in a halogen-based gas atmosphere) to convert the contact opening 36 into a substrate contact trench 39. Then, ion implantation is conducted to form a P+ body contact region 23. This ion implantation is conducted under the following conditions: ion species: $BF_2$, implantation energy: about 30 keV, dosage: for example, preferably on the order of $10^{15}/cm^2$ (for example, on the order of about $10^{19}/cm^3$ in terms of concentration). Such a substrate etching is useful for a contact structure but needless to say, it is not essential.

Next, as shown in FIG. 21, an aluminum-based metal layer is formed on almost the entire surface of the semiconductor wafer 1 on the side of the surface 1a via a barrier metal film such as TiW by using sputtering or the like and it is patterned into a metal source electrode 5, a metal field plate 62 (FIG. 2) of a source potential, a guard ring electrode 3 (FIG. 2), and the like. In practice, a portion of the barrier metal reacts with the silicon substrate to be a silicide but details of it are not shown here because it is cumbersome.

If necessary, a passivation film such as inorganic final passivation film or an organic final passivation film is then formed thereover and a pad opening and a gate opening are made therein. As the final passivation film, as well as a single-layer film such as inorganic final passivation film or an organic final passivation film, a film stack obtained by stacking an organic final passivation film or the like over the inorganic final passivation film may be used.

Next, back grinding treatment is conducted to decrease the original thickness of the wafer (for example, from about 450 to 750 μm) to, for example, from 80 to 280 μm (for example, less than 300 μm). In other words, thinning is conducted by removing the back surface 1b of the wafer 1 until it reaches the upper end portion 14 by back grinding.

Next, as shown in FIG. 22, a back-surface metal drain electrode 24 is formed on the back surface 1b of the wafer 1 by using sputtering film formation. The back-surface metal electrode film 24 is comprised of, in the order from the side near the wafer 1, a back-surface titanium film (a diffusion preventing layer of gold and nickel), a back-surface nickel film (adhesion layer with a chip bonding material), a back-surface gold film (an antioxidant layer of nickel), and the like. It is needless to say that the kind of the back-surface metal differs, depending on each specification so that metals other than those described above can be used. Then, the wafer is divided into individual chips. As a result, the device as shown in FIG. 2 can be obtained. Moreover, a package step (and further, module formation, if necessary) such as transfer mold with a molding resin may be conducted as needed.

4. Complementary Description on the Above-Mentioned Embodiment (Including Modification Example) and General Consideration (Mainly FIG. 23 to FIG. 26)

Figure 23:
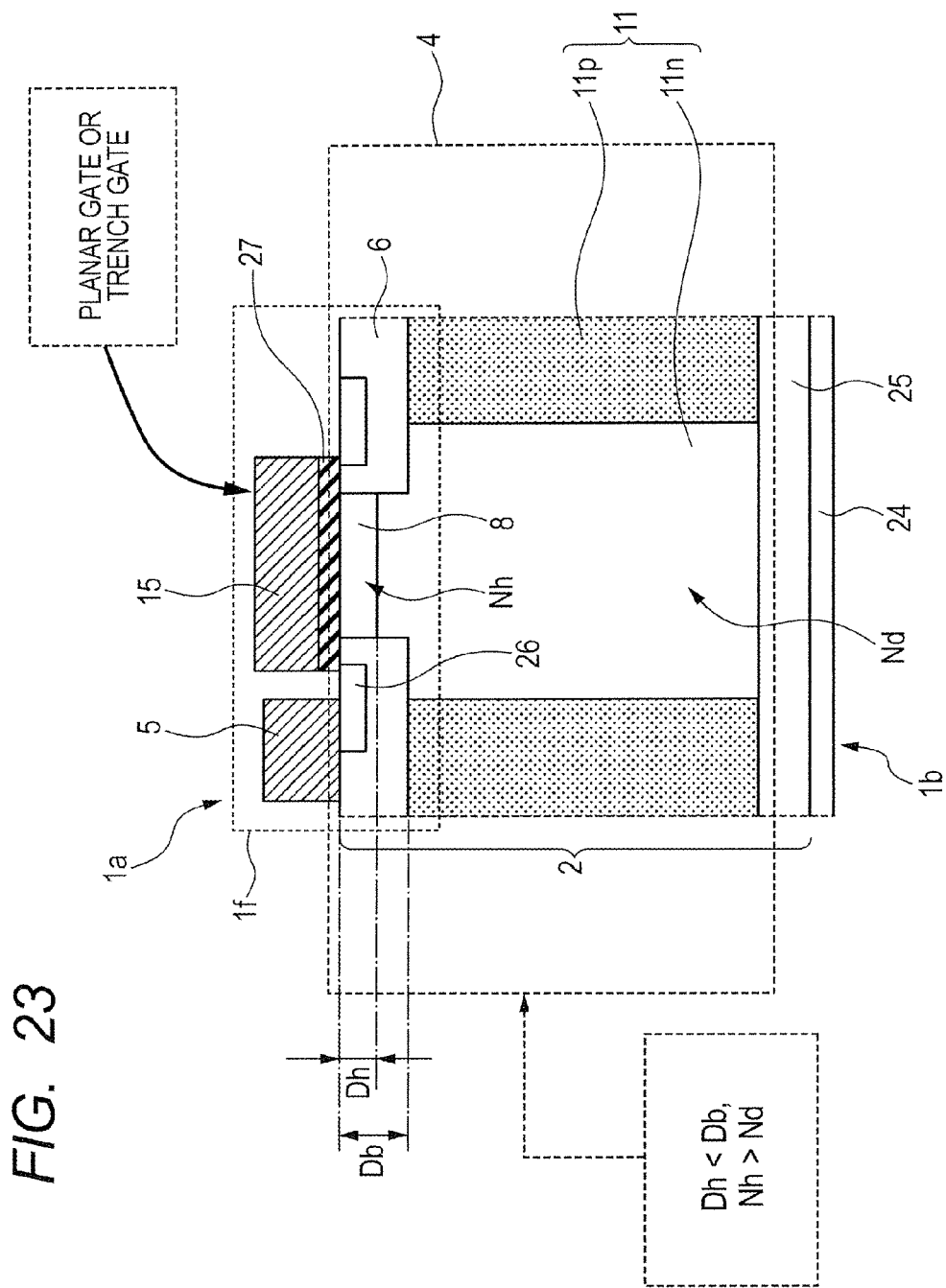
FIG. 23 is a device fragmentary cross-sectional view for describing the outline of the device structure of the vertical power MOSFET according to First Embodiment of the present application.
Figure 24:
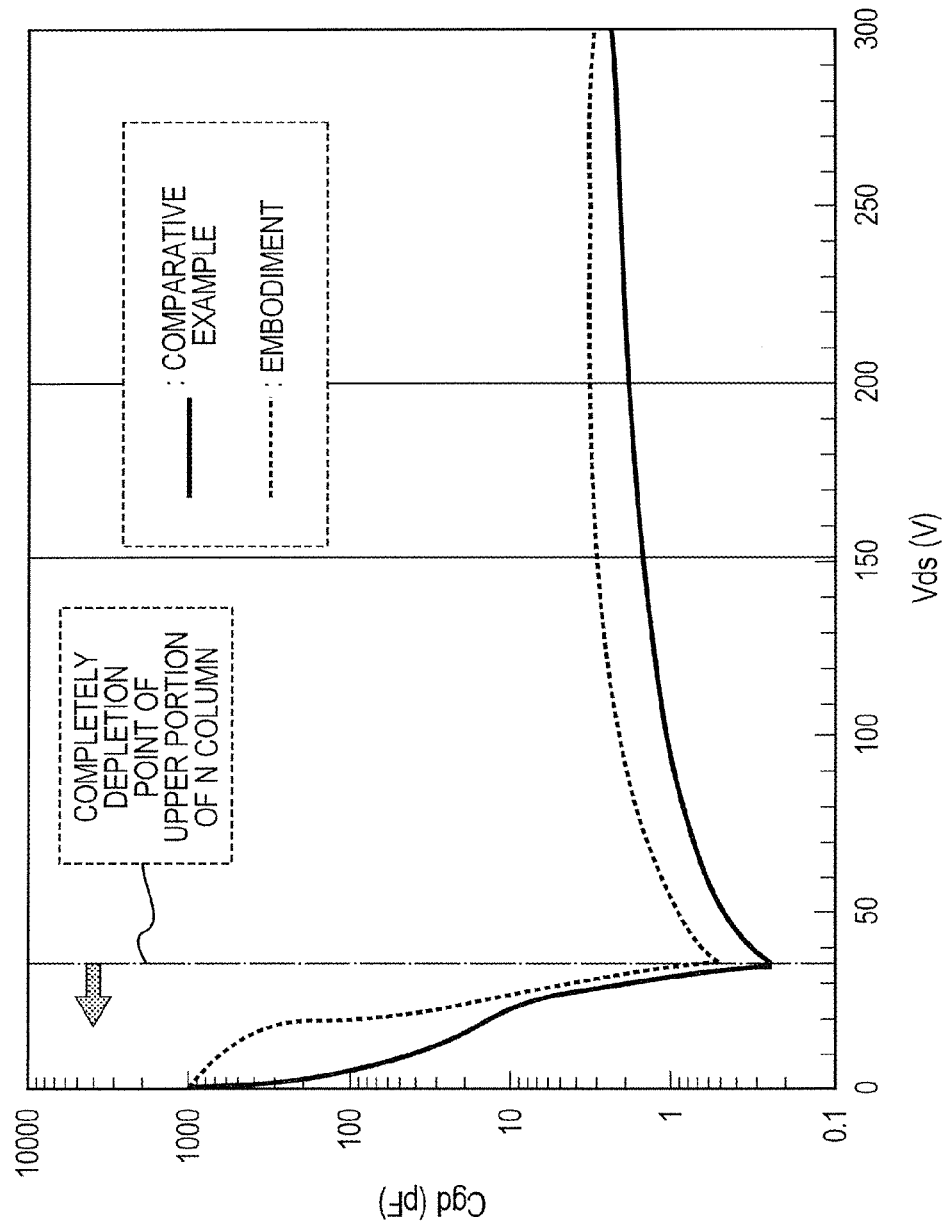
FIG. 24 is a simulation result plot showing comparison, in a change of a gate-drain capacitance Cgd as a function of a drain-source voltage Vds, between the vertical planar power MOSFET (First Embodiment of the present application) having an undergate heavily doped N type region and a vertical planar power MOSFET (comparative example) not having an undergate heavily-doped N type region.
Figure 25:
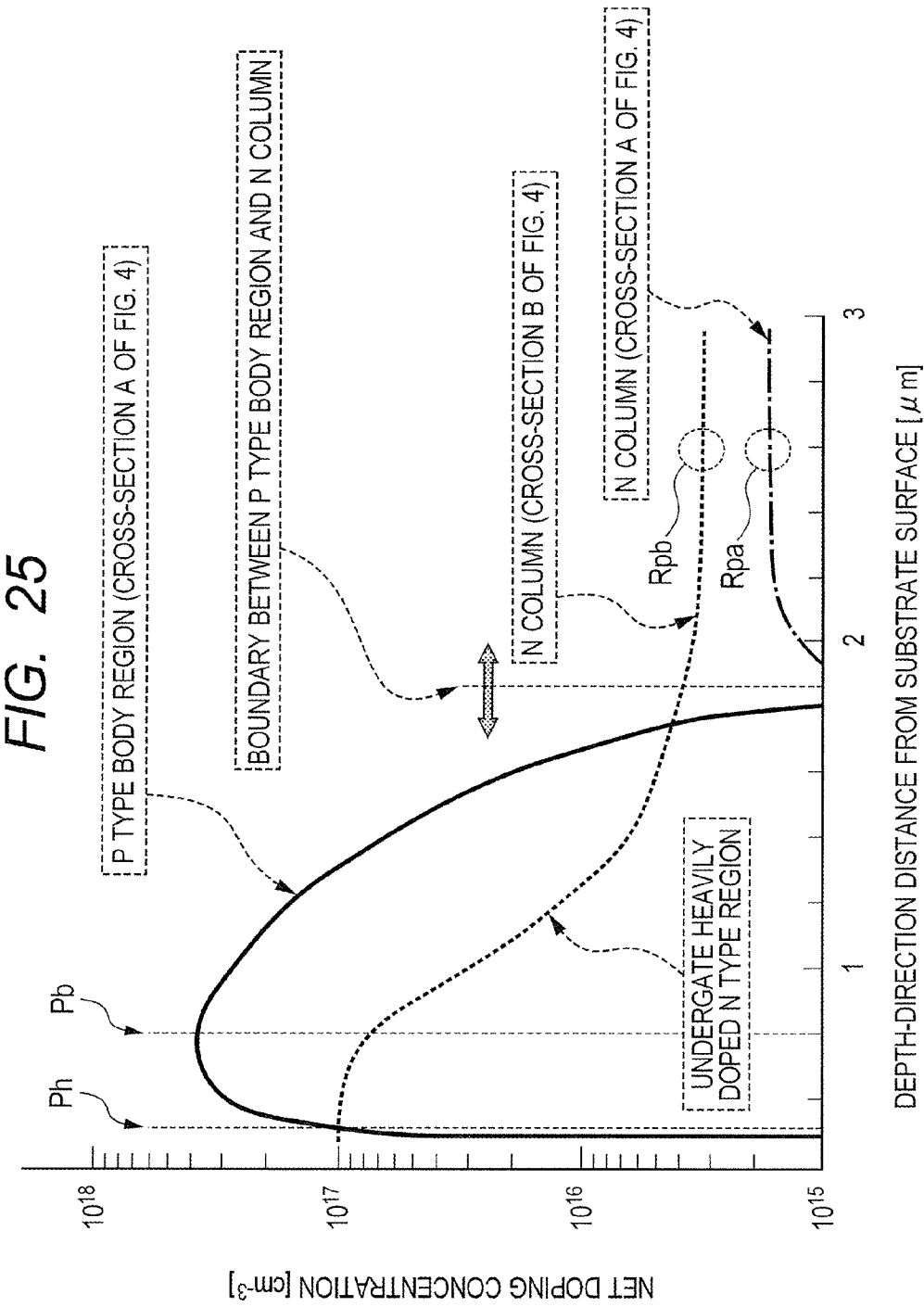
FIG. 25 is a net doping concentration profile plot, in a depth direction from the substrate surface, of a (channel)-(P type body)-(N column cross-section A) and (undergate heavily doped N type region)-(N column cross-section B) shown in FIG. 4.
Figure 26:
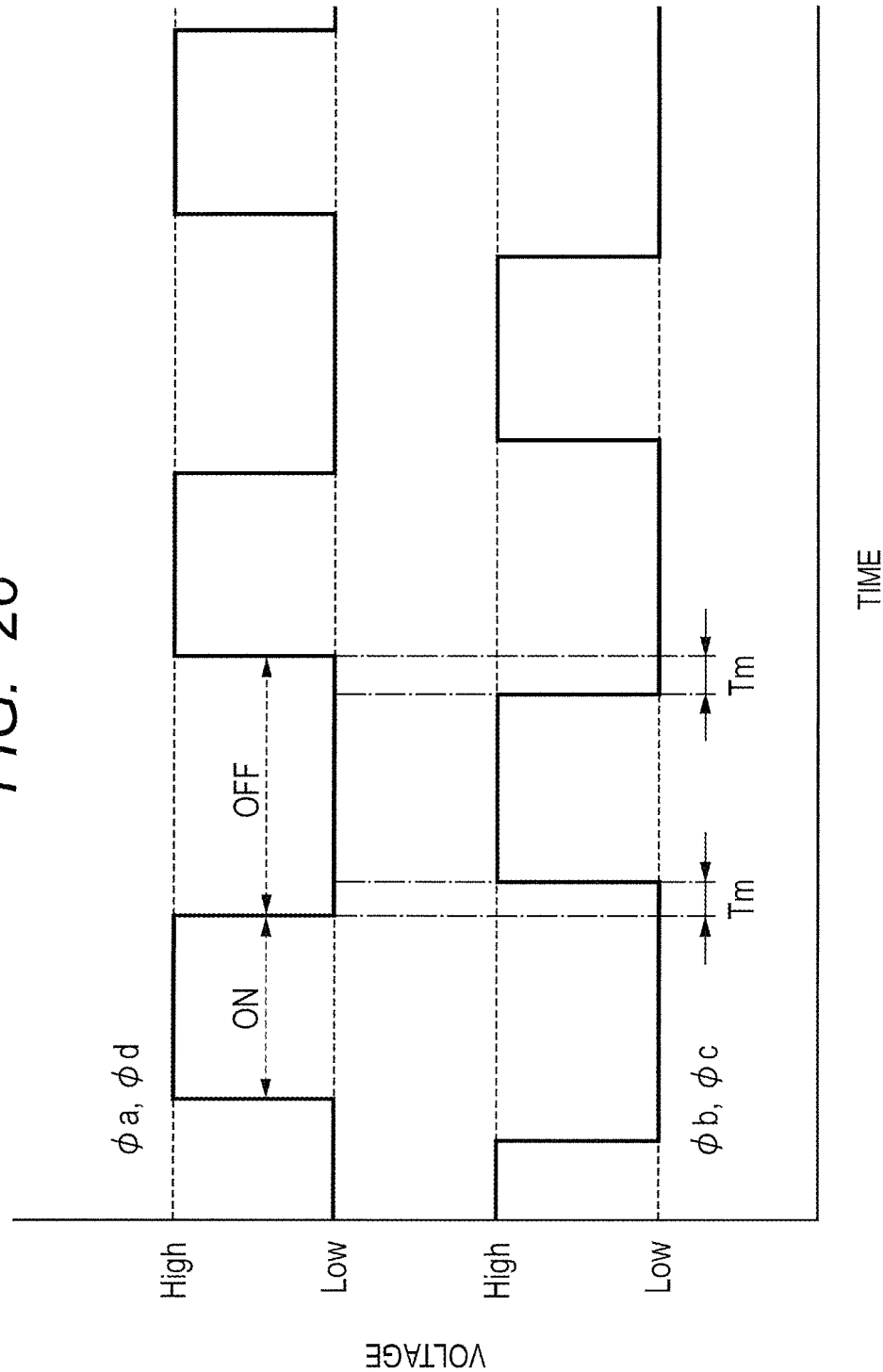
FIG. 26 is a signal waveform showing one example of a gate drive signal of FIG. 1.
Figure 27:
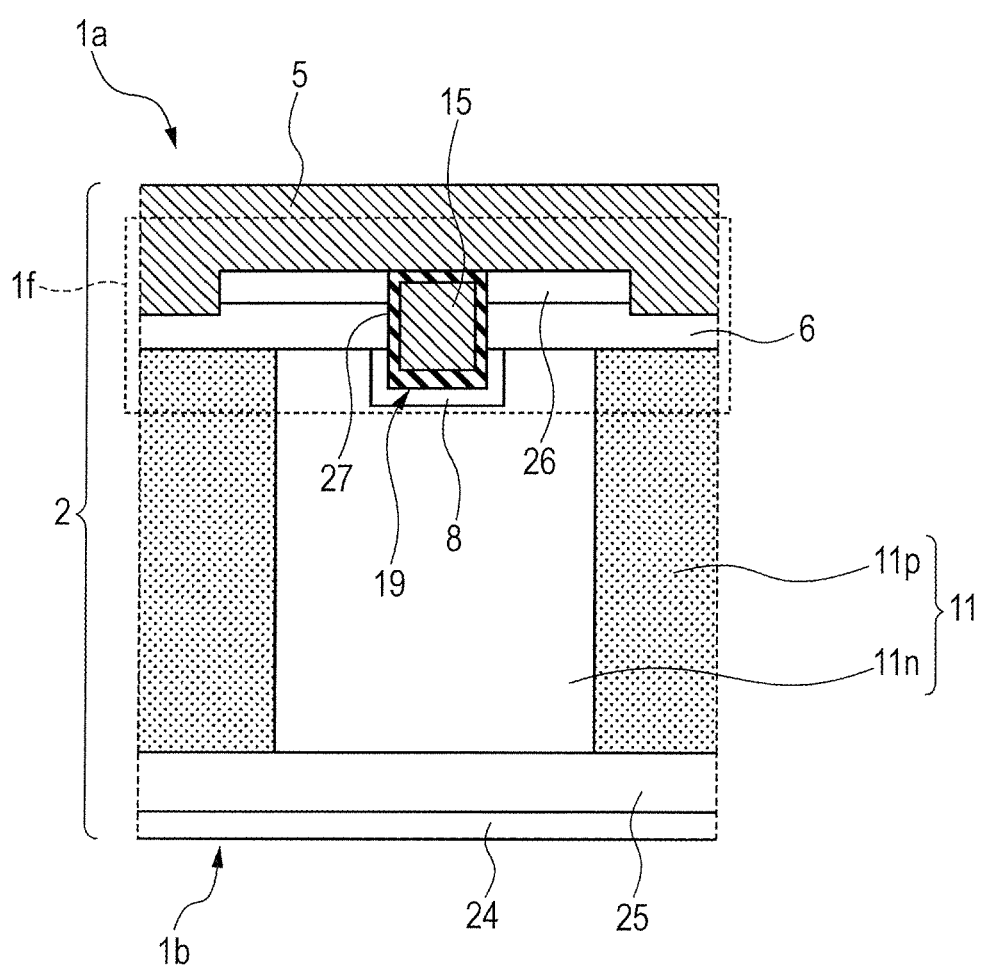
FIG. 27 is a device schematic cross-sectional view substantially corresponding to FIG. 4, for describing the cell structure of a modification example (trench gate vertical power MOSFET) of a gate structure of the vertical power MOSFET according to First Embodiment of the present application.

FIG. 23 is a device fragmentary cross-sectional view for describing the outline of the device structure of the vertical power MOSFET according to First Embodiment of the present application. FIG. 24 is a simulation result plot showing comparison, in a change of a gate-drain capacitance Cgd as a function of a drain-source voltage Vds, between the vertical planar power MOSFET (First Embodiment of the present application) having an undergate heavily doped N type region and a vertical planar power MOSFET (comparative example) not having an undergate heavily-doped N type region. FIG. 25 is a net doping concentration profile plot, in a depth direction from the substrate surface, of a (channel)-(P type body)-(N column cross-section A) and (undergate heavily doped N type region)-(N column cross-section B) shown in FIG. 4. FIG. 26 is a signal waveform showing one example of a gate drive signal of FIG. 1. FIG. 27 is a device schematic cross-sectional view, substantially corresponding to FIG. 4, for describing the cell structure of a modification example (trench gate vertical power MOSFET) of a gate structure of the vertical power MOSFET according to First Embodiment of the present application. The following are a complementary description on the above-mentioned embodiment (including a modification example) and general consideration based on these drawings.

(1) Description on technical background (refer to mainly FIG. 1):

For example, in domestic air conditioners, an IGBT (insulated gate bipolar transistor) has been used as a motor drive circuit element as shown in FIG. 1 in combination with a fly-back diode. The IGBT is a bipolar element so that it has however the problem of a large switching loss. Replacement of it with a power MOSFET having a super junction having lower on-resistance and high-speed switching capability has been investigated. In addition to the above-mentioned advantage, this power MOSFET essentially has a built-in body diode so that a fly-back diode can be omitted.

As described above, however, it has the advantage of high switching speed during turn off in switching operation due to rapid depletion of an N type drift region. On the other hand, it has the disadvantage that it is likely to cause ringing.

It is known that ringing occurs when rise of a drain voltage during turn off, that is, "dV/dt" is large due to excessively high speed switching. In order to overcome this ringing, an increase in external gate resistance ("external gate resistance increase") is thought as one measure, but there is a possibility of it damaging the advantage of high-speed switching.

The power MOSFET having a super junction has a small gate-drain capacitance Cgd (refer to FIG. 24) so that it is likely to have a greater "dV/dt" and induce ringing. A decrease in film thickness of a gate insulating film ("gate insulating film thinning") is thought as another measure but it is a trade-off with deterioration in reliability or the like. An increase in cell pitch ("cell pitch extension") to increase the gate-drain capacitance Cgd can also be thought as a further measure, but it is also a trade-off with an increase in on resistance.

Although First Embodiment of the present application does not completely exclude the introduction of the above-mentioned measures such as external gate resistance increase, gate insulating film thinning, and cell pitch extension without damaging the advantage of the power MOSFET having a super junction, it intends to prevent ringing as much as possible without decreasing the advantage. In embodiments (including modification examples) of the present application, therefore, such supportive measures may be used in combination.

(2) Description on the outline of the device structure of the power MOSFET according to First Embodiment of the present application (mainly, FIG. 23)

The vertical power MOSFET having a super junction according to First Embodiment of the present application has therefore the following configuration. Described specifically, it is provided, in the surface of a columnar first conductivity type drift region 11n along a gate electrode 15 and between a pair of second conductivity type body regions 6 adjacent to each other, with a first conductivity type undergate heavily doped N type region 8 having a depth shallower than that of a body region 6 and a concentration higher than that of the columnar first conductivity type drift region 11n. The gate electrode structure of it may be either a planar gate type or a trench gate type.

The depth Dh (depth of a concentration peak portion from the substrate surface) of this undergate heavily doped N type region 8 is set shallower than the depth Db of the body region 6. When the depth Dh of the undergate heavily doped N type region 8 is deeper than the depth Db of the body region 6, electric field concentration occurs at the corner portion of the body region 6, leading to a reduction in withstand voltage.

Moreover, the impurity concentration Nh (net dopant concentration of the concentration peak portion) of the undergate heavily doped N type region 8 is set higher than the impurity concentration Nd (a typical value in the vicinity of a portion where the undergate heavily doped N type region 8 is present) of the columnar first conductivity type drift region 11n to which the undergate heavily doped N type region belongs, because if not so, an effect of suppressing a depletion rate cannot be expected.

By setting as described above, a gate-drain capacitance Cgd (refer to FIG. 24) can be increased at an early stage of widening of a depletion layer when the transistor is turned off. It is therefore possible to prevent ringing without damaging the withstand voltage characteristics, switching characteristics, and the like.

(3) Consideration on reason of preventing ringing (mainly, FIG. 24)

This sub-section describes comparison in characteristics between the vertical planar power MOSFET having a super junction according to First Embodiment of the present application and described in Section 2 (having an undergate heavily doped N type region, that is, "embodiment device") and a device having a similar structure to the embodiment device except that it has no undergate heavily doped N type region, that is, "comparative example device".

FIG. 24 shows simulation results of dependence of gate-drain capacitance Cgd on drain-source voltage Vds in the embodiment device and comparative example device. As shown in FIG. 24, in the embodiment device, gate-drain capacitance Cgd shows an increase effectively at a point where punch-through of a pair of depletion layers extending along the interfaces between a pair of the columnar P type drift regions 11p adjacent to each other and the columnar N type drift region 11n, that is, on the side of the drain-source voltage Vds lower than the inflexion point in this diagram. This means that occurrence of ringing is prevented by increasing the gate-drain capacitance Cgd at an early stage (a part contributing occurrence of ringing) until complete depletion of the upper portion of the N column 11n. Due to the presence of the undergate heavily doped N type region 8, a depletion rate decreases under the gate electrode (under the gate and at the periphery thereof in a trench gate). During this period, an electric current almost decays and therefore an increase in turn-off loss hardly occurs so that a trade-off with withstand voltage or an increase in switching loss can be avoided.

(4) Consideration on the concentration distribution of undergate heavily doped N type region (mainly, FIG. 25)

In this sub-section, in order to clearly show the relationship of an impurity concentration in the main parts in First Embodiment, an impurity concentration profile Rpa of the (channel)-(P type body)-(N column) cross-section A and an impurity concentration profile Rpb of the (undergate heavily doped N type region)-(N column) cross-section B are shown in FIG. 25. As shown in FIG. 25, the concentration peak Ph (the cross-section B in FIG. 4) of the undergate heavily doped N type region 8 (undergate heavily doped N type region having the first conductivity type) is at a position shallower than the concentration peak Pb (cross-section A in FIG. 4) of the P type body region 6 (body region having the second conductivity type). This means that the depth of the undergate heavily doped N type region 8 is shallower than that of the body region. Here, the concentration peak Ph (cross-section B in FIG. 4) has a flat portion at a position nearer to the surface from the inside of the substrate.

The net doping concentration at the concentration peak Ph (cross-section B in FIG. 4) of the undergate heavily doped N type region 8 is higher than a typical value (for example, average value) of the net doping concentration in the same cross-section (cross-section B in FIG. 4) of the N column 11n to which the undergate region belongs. This means that the concentration of the undergate heavily doped N type region 8 is higher than that of the columnar N type drift region 11n (columnar first conductivity type drift region or N column region) to which the undergate region belongs. In general, the net doping concentration of the N column 11n at the same depth is higher in the cross-section B of FIG. 4 than in the cross-section A of FIG. 4. This owes to the influence of boron diffused from the columnar P type drift region 11p (columnar second conductivity type drift region or P column region).

Moreover, as can be seen from FIG. 25, in this example, the net doping concentration at the concentration peak Ph (cross-section B in FIG. 4) of the undergate heavily doped N type region 8 is lower than the net doping concentration at the concentration peak Pb (cross-section A in FIG. 4) of the P type body region 6 (second conductivity type body region) along the cross-section A in FIG. 4. This means the concentration of the undergate heavily doped N type region 8 is lower than that of the body region 6.

(5) Specific description on circuit operation in FIG. 1 (mainly FIG. 26, refer to FIG. 1)

FIG. 26 shows one specific example of gate drive signals φa, φb, φc, and φd (suffixes correspond to suffixes of the MOSFETs and body diode portions of FIG. 1, respectively) to the inverter circuit shown in FIG. 1. As shown in FIG. 26, in the circuit shown in FIG. 1, ON/OFF is repeated alternately due to diagonal synchronism. Described specifically, a first pair composed of MOSFETS (71a, 71d) and a second pair composed of MOSFETs (71b, 71c) synchronize, respectively and ON/OFF is repeated. When there is a time when the first pair and the second pair are ON at the same time, a large through current flows, which increases a power loss. Usually, a masking time Tm (for example, about 50 ns) when both pairs are OFF is provided. During this masking time Tm, body diode portions in the MOSFETs on the side opposite to a leg which has been ON until just before are turned ON and a fly wheel current runs. More specifically, for example, when the MOSFETs (71a, 71d) are turned off, the body diode portions (72b, 72c) are turned on and a fly wheel current flows.

(6) Description on the cell structure and the like of an example (trench gate vertical power MOSFET) modified in gate structure of the vertical power MOSFET according to First Embodiment of the present application (mainly FIG. 27, refer to FIG. 4)

An example described in this sub-section is a modification example, in gate structure, of the planar type MOSFET described in Section 2 (FIG. 4, etc.).

As shown in FIG. 27, a difference from FIG. 4 is that a gate electrode 15 is formed in a gate housing trench 19. Described specifically, the gate electrode 15 is provided, via a gate insulating film, in a surface region if (here, in the gate housing trench 19) on the side of the device surface 1a (first main surface) of the semiconductor chip 2 (semiconductor substrate) and on the surface of the columnar N type drift region 11n (columnar first conductivity type drift region or N column region).

The undergate heavily doped N type region 8 (first conductivity undergate heavily doped N type region) may be formed, for example, by introducing a P type body region 6 (second conductivity type body region) and forming a gate housing trench 19 in accordance with the conventional trench gate process and then introducing N type impurity ions into the entirety of the cell region 4 by ion implantation or the like in a manner similar to that employed in FIG. 11.

Compared with the planar gate type power MOSFET (example in Section 2), the trench gate type power MOSFET described here is relatively disadvantageous in applications requiring a high withstand voltage (withstand voltage of from about 400 to 1200V) exceeding a withstand voltage of 400V, but has the advantage that low on resistance can be easily realized in applications requiring a withstand voltage exceeding 200V but not greater than 400V (withstand voltage around 300V).

5. Summary

The invention made by the present inventors has been described specifically based on embodiments. It is needless to say that the invention is not limited to or by these embodiments but can be changed in various ways without departing from the gist of the invention.

For example, in the above-mentioned embodiment, a specific description has been made mainly with a planar type power MOSFET as an example. The invention is not limited to it and needless to say, the invention can be applied also to a trench gate type power MOSFET or the like as described above in Section 4.

Further, in the above-mentioned embodiment, a specific description has been made mainly with a power MOSFET having a super junction structure as an example. The invention is not limited to it and needless to say, it can also be applied to a conventional power MOSFET having no super junction structure and having, as a main part of the drift region thereof, a single conductivity type drift region.

Still further, in the above-mentioned embodiment, a specific description has been made mainly with a vertical type power MOSFET having a super junction structure as an example.

The present invention is not limited to it. It is needless to say that the invention can be applied to a lateral type power MOSFET whether it has a super junction structure or not.

In the above-mentioned embodiment, an aluminum-based metal film or the like has been used mainly as the metal source electrode material. The invention is not limited to it. It is needless to say that as well as the aluminum-based metal film, tungsten, copper, gold, silver, titanium, palladium, TiW, TiN, another metal, or an alloy film (including a composite film) can also be used.

Similarly, in the above-mentioned embodiment, a specific description has been made mainly with a polysilicon film as an example of the gate electrode material. The present invention is not limited to it, but needless to say, a silicide film, a polycide film, a tungsten film, a titanium film, another metal film such as TiW or TiN, a metal nitride film, or an alloy film (including a composite film) may be used as well as the polysilicon film.

What is claimed is:

1. A vertical power MOSFET, comprising:
   (a) a silicon based semiconductor substrate having a first main surface and a second main surface;
   (b) a cell region extending from the first main surface of the semiconductor substrate to the inside thereof;
   (c) a drain region having N conductivity provided in the surface of the second main surface;
   (d) a drift region which is provided in the cell region and in a main portion extending from a boundary with the drain region to the first main surface, and in which columnar N conductivity drift regions and columnar P conductivity drift regions are placed alternately;
   (e) a gate electrode provided, via a gate insulating film, in a surface region on the side of the first main surface and over the surface of each of the columnar N conductivity drift regions;
   (f) a body region having P conductivity provided in the surface of the drift region on the side of the first main surface and extending from each of the columnar P conductivity drift regions to the columnar N conductivity drift region adjacent thereto, the body region having a net doping concentration that peaks between about $10^{17}$ cm$^{-3}$ and about $10^{18}$ cm$^{-3}$ between the first main surface and a depth of about 1 μm from the first surface and which declines to $10^{15}$ cm$^{-3}$ before reaching 2 microns from the first main surface so as to define a boundary between the P conductivity body region and the columnar N conductivity drift region;
   (g) an undergate heavily doped N region provided in the surface of each of the columnar N conductivity drift regions along the gate electrode and between a pair of the body regions adjacent to each other, having a depth shallower than that of the body region, and having a concentration higher than that of the columnar N conductivity drift region, the undergate heavily doped N region having a flat portion at a position nearer to the first main surface from inside the substrate, and having a net doping concentration that ranges from about $10^{17}$ cm$^3$ near to the first main surface to about between $10^{16}$ cm$^{-3}$ and $10^{15}$ cm$^{-3}$ at a depth of about 2 μm from the first main surface;
   (h) a source region having the N conductivity provided in the surface of each of the body regions and extending from the vicinity of the end portion of the gate electrode to the outside and having a concentration higher than that of the undergate heavily doped N region;
   (i) a metal source electrode provided over the first main surface of the semiconductor substrate and electrically coupled to the body region and the source region; and
   (j) a metal drain electrode provided over the second main surface of the semiconductor substrate and electrically coupled to the drain region,
   wherein a profile of a channel P body-N column cross section A has a net doping concentration of about $2 \times 10^{15}$ cm$^{-3}$ between a distance of about 2 μm and 3 μm from the first main surface.

2. The vertical power MOSFET according to claim 1, wherein the undergate heavily doped N region has an impurity concentration higher than that of the columnar P conductivity drift region.

3. The vertical power MOSFET according to claim 2, wherein an impurity having the N conductivity for forming the undergate heavily doped N region is introduced by ion implantation.

4. The vertical power MOSFET according to claim 3, wherein the undergate heavily doped N region has a concentration lower than that of the body region.

5. The vertical power MOSFET according to claim 4, wherein the impurity having the N conductivity for forming the undergate heavily doped N region is introduced in a region wider than a region between the pair of the body regions adjacent to each other.

6. The vertical power MOSFET according to claim 5, wherein the impurity having the N conductivity for forming the undergate heavily doped N region is introduced in almost the entirety of the cell region.

7. The vertical power MOSFET according to claim 6, wherein the gate electrode is provided over the entire surface of a portion facing onto the undergate heavily doped N region.

8. The vertical power MOSFET according to claim 7, which is for use in a motor drive.

9. The vertical power MOSFET according to claim 6, which is a planar gate type.

10. The vertical power MOSFET according to claim 6, which is a trench gate type.

11. The vertical power MOSFET according to claim 1, wherein a profile of an undergate heavily doped N column B has a net doping concentration of about 3 to $4 \times 10^{15}$ cm$^{-3}$ between a distance of about 2 μm and 3 μm from the first main surface.

12. The vertical power MOSFET according to claim 1, wherein a pitch of a superjunction is about 10 μm.

* * * * *